US007298293B2

(12) United States Patent
Narayanan

(10) Patent No.: US 7,298,293 B2
(45) Date of Patent: Nov. 20, 2007

(54) METHOD FOR ENCODING DATA

(75) Inventor: Sarukkai R. Narayanan, 3121 N. Harvey Pkwy., Oklahoma City, OK (US) 73118

(73) Assignee: Sarukkai R. Narayanan, Oklahoma City, OK (US)

(*) Notice: Subject to any disclaimer, the term of this patent is extended or adjusted under 35 U.S.C. 154(b) by 0 days.

(21) Appl. No.: 11/436,259

(22) Filed: May 18, 2006

(65) Prior Publication Data

US 2006/0273935 A1    Dec. 7, 2006

Related U.S. Application Data

(60) Provisional application No. 60/687,604, filed on Jun. 3, 2005.

(51) Int. Cl.
*H03M 5/02* (2006.01)

(52) U.S. Cl. .................................................... 341/56
(58) Field of Classification Search ................ 341/59, 341/95, 106, 56, 57; 360/40
See application file for complete search history.

(56) References Cited

U.S. PATENT DOCUMENTS

| 5,486,828 A * | 1/1996 | Mikami ........................ 341/59 |
| 6,559,980 B1 * | 5/2003 | Joffe ........................... 358/442 |
| 6,912,646 B1 * | 6/2005 | Khu ............................ 711/219 |

* cited by examiner

*Primary Examiner*—Brian Young
(74) *Attorney, Agent, or Firm*—Dunlap, Codding & Rogers, P.C.

(57) ABSTRACT

A method for encoding data includes a super cooling process wherein an input stream is manipulated, encoded and summarized to form entities that represent the input stream in a different form in super cooled sets. The super cooled sets can be used for example for the transmission and/or storage of the information contained within the input stream.

18 Claims, 21 Drawing Sheets

| B | A | B | A | B | C | B | A | B | C | B | A | B | A | B | C | D | A | B | C | C | A | C | A | D | A | C | A | C | A | C | B | C | A | C | B | D | A |
|---|---|---|---|---|---|---|---|---|---|---|---|---|---|---|---|---|---|---|---|---|---|---|---|---|---|---|---|---|---|---|---|---|---|---|---|---|---|
|SP1|SP2|SP3|SP4|SP5|SP6|SP7|SP8|SP9|SP10|SP11|SP12|SP13|SP14|SP15|SP16|SP17|SP18|SP19|SP20|SP21|SP22|SP23|SP24|SP25|SP26|SP27|SP28|SP29|SP30|SP31|SP32|SP33|SP34|SP35|SP36|SP37|SP38|SP39|SP40|SP41|SP42|SP43|

First Group Bubble

First Group Gum Drop Pairs    odd/even

First Group

| Odd Gum Drop Pairs | Gum Drop Pair Type | Count |
|---|---|---|
| SP43-RP3  = DA-DC | DA-DC | 1 |
| SP41-RP5  = CB-BA | CB-BA | 2 |
| SP39-RP7  = CA-BC | CA-BC | 1 |
| SP37-RP9  = CB-BA | | |
| SP35-RP11 = CA-BA | CA-BA | 5 |
| SP33-RP13 = CA-BA | | |
| SP31-RP15 = DA-DA | DA-DA | 1 |
| SP29-RP17 = CA-BA | | |
| SP27-RP19 = CA-BA | | |
| SP25-RP21 = CA-BA | | |

| Even Gum Drop Pairs | Gum Drop Pair Type | Count |
|---|---|---|
| SP42-RP4  = BD-CB | BD-CB | 1 |
| SP40-RP6  = AC-AB | AC-AB | 5 |
| SP38-RP8  = BC-CB | BC-CB | 1 |
| SP36-RP10 = AC-AB | | |
| SP34-RP12 = AC-AB | | |
| SP32-RP14 = AC-AD | AC-AD | 1 |
| SP30-RP16 = AD-AB | AD-AB | 1 |
| SP28-RP18 = AC-AB | | |
| SP26-RP20 = AC-AB | | |

*FIG. 4R*

| Fully Qualified Adjacently Disposed Gum Drop Pairs | First Group Partially Qualified Adjacent Gum Drop Pairs | Partially Qualified Adjacent Gum Drop Pairs Types | Count |
|---|---|---|---|
| SP43-RP3 = DA-DC<br>SP42-RP4 = BD-CB | DA: BD-CB | DA: BD-CB | 1 |
| SP42-RP4 = BD-CB<br>SP41-RP5 = CB-BA | BD: CB-BA | BD: CB-BA | 1 |
| SP41-RP5 = CB-BA<br>SP40-RP6 = AC-AB | CB: AC-AB | CB: AC-AB | 2 |
| SP40-RP6 = AC-AB<br>SP39-RP7 = CA-BC | AC: CA-BC | AC: CA-BC | 1 |
| SP39-RP7 = CA-BC<br>SP38-RP8 = BC-CB | CA: BC-CB | CA: BC-CB | 1 |
| SP38-RP8 = BC-CB<br>SP37-RP9 = CB-BA | BC: CB-BA | BC: CB-BA | 1 |
| SP37-RP9 = CB-BA<br>SP36-RP10 = AC-AB | CB: AC-AB | | |
| SP36-RP10 = AC-AB<br>SP35-RP11 = CA-BA | AC: CA-BA | AC: CA-BA | 4 |
| SP35-RP11 = CA-BA<br>SP34-RP12 = AC-AB | CA: AC-AB | CA: AC-AB | 3 |
| SP34-RP12 = AC-AB<br>SP33-RP13 = CA-BA | AC: CA-BA | | |
| SP33-RP13 = CA-BA<br>SP32-RP14 = AC-AD | CA: AC-AD | CA: AC-AD | 1 |
| SP32-RP14 = AC-AD<br>SP31-RP15 = DA-DA | AC:DA-DA | AC:DA-DA | 1 |
| SP31-RP15 = DA-DA<br>SP30-RP16 = AD-AB | DA: AD-AB | DA: AD-AB | 1 |
| SP30-RP16 = AD-AB<br>SP29-RP17 = CA-BA | AD:CA-BA | AD:CA-BA | 1 |
| SP29-RP17 = CA-BA<br>SP28-RP18 = AC-AB | CA:AC-AB | | |
| SP28-RP18 = AC-AB<br>SP27-RP19 = CA-BA | AC:CA-BA | | |
| SP27-RP19 = CA-BA<br>SP26-RP20 = AC-AB | CA:AC-AB | | |
| SP26-RP20 = AC-AB<br>SP25-RP21 = CA-BA | AC:CA-BA | | |

*FIG. 4S*

Super Cooled Set - First Group 1) 44 (total droplets in input stream)
2) 22 (number of source pucks)
3) 23 (number of reverse pucks)
4) BA (bubble scum)
5) DA-DC (starting gum drop pair)
   DA-DC*BD-CB (starting adj. gum drop pair)
6) CA-BA (ending gum drop pair)
   AC-AB *CA-BA (ending adj. gum prop pair)
7) DA-DC = 1
   CB-BA = 2
   CA-BC = 1           (odd gum drop
   CA-BA = 5           pair type and count)
   DA-DA = 1

BD-CB = 1
   AC-AB = 5           (even gum drop
   BC-CB = 1           pair type and count)
   AC-AD = 1
   AD-AB = 1

8) DA:BD-CB = 1
   BD:CB-BA = 1
   CB-AC-AB = 2
   AC:CA-BC = 1        (Adjacent gum drop
   AC:CC-CB = 1        pairs type and count)
   BC:CB-BA = 1
   AC:CA-BA = 4
   CA:AC-AB = 3
   CA:AC-AD = 1
   AC:DA-DA = 1
   DA:DA-AB = 1
   AD:CA-BA = 1

9) A B
   C A        (inversion pucks)
   B B
   C C

10) N/A       (padding droplets)

| Second Group Bubble | | Second Group Gum Drop Pairs | (odd/even) |
|---|---|---|---|
| SP1 | = B  A | RP43-SP3 = CA-BA | (o) |
| SP2-RP43 | = A B-C A | RP42-SP4 = AC-AB | (e) |
| SP3-RP42 | = B A-A C | RP41-SP5 = CA-BC | (o) |
| SP4-RP41 | = A B-C A | RP40-SP6 = BC-CB | (e) |
| SP5-RP40 | = B C-B C | RP39-SP7 = CB-BA | (o) |
| SP6-RP39 | = C B-C B | RP38-SP8 = AC-AB | (e) |
| SP7-RP38 | = B A-A C | RP37-SP9 = CA-BC | (o) |
| SP8-RP37 | = A B-C A | RP36-SP10 = BC-CB | (e) |
| SP9-RP36 | = B C-B C | RP35-SP11 = CB-BC | (o) |
| SP10-RP35 | = C B-C B | RP34-SP12 = BC-CB | (e) |
| SP11-RP34 | = B C-B C | RP33-SP13 = CB-BA | (o) |
| SP12-RP33 | = C B-C B | RP32-SP14 = AC-AB | (e) |
| SP13-RP32 | = C B-C B | RP31-SP15 = CA-BA | (o) |
| SP14-RP31 | = A B-C A | RP30-SP16 = AC-AB | (e) |
| SP15-RP30 | = B A-A C | RP29-SP17 = CA-BC | (o) |
| SP16-RP29 | = A B-C A | RP28-SP18 = BC-CD | (e) |
| SP17-RP28 | = B C-B C | RP27-SP19 = DB-DA | (o) |
| SP18-RP27 | = C D-D B | RP26-SP20 = AD-AB | (e) |
| SP19-RP26 | = D A-A D | RP25-SP21 = CA-BC | (o) |
| SP20-RP25 | = A B-C A | | |
| SP21-RP24 | = B C-B C | | |
| SP22-RP23 | = C C-B B | | |
| SP23-RP22 | = C A-A B | | |

FIG. 4T  FIG. 4U  FIG. 4V

Second Group

| Odd Gum Drop Pairs | Gum Drop Pair Type | Count |
|---|---|---|
| RP43-SP3  = CA-BA | CA-BA | 2 |
| RP41-SP5  = CA-BC | CA-BC | 4 |
| RP39-SP7  = CB-BA | CB-BA | 2 |
| RP37-SP9  = CA-BC | | |
| RP35-SP11 = CB-BC | CB-BC | 1 |
| RP33-SP13 = CB-BA | | |
| RP31-SP15 = CA-BA | | |
| RP29-SP17 = CA-BC | | |
| RP27-SP19 = DB-DA | DB-DA | 1 |
| RP25-SP21 = CA-BC | | |

| Even Gum Drop Pairs | Gum Drop Pair Type | Count |
|---|---|---|
| RP42-SP4  = AC-AB | AC-AB | 4 |
| RP40-SP6  = BC-CB | BC-CB | 3 |
| RP38-SP8  = AC-AB | | |
| RP36-SP10 = BC-CB | | |
| RP34-SP12 = BC-CB | | |
| RP32-SP14 = AC-AB | | |
| RP30-SP16 = AC-AB | | |
| RP28-SP18 = BC-CD | BC-CD | 1 |
| RP26-SP20 = AD-AB | AD-AB | 1 |

*FIG. 4W*

| Fully Qualified Adjacently Disposed Gum Drop Pairs | Second Group Partially Qualified Adjacent Gum Drop Pairs | Partially Qualified Adjacent Gum Drop Pairs Types | Count |
|---|---|---|---|
| RP43-SP3 = CA-BA<br>RP42-SP4 = AC-AB | CA: AC-AB | CA: AC-AB | 2 |
| RP42-SP4 = AC-AB<br>RP41-SP5 = CA-BC | AC: CA-BC | AC: CA-BC | 3 |
| RP41-SP5 = CA-BC<br>RP40-SP6 = BC-CB | CA: BC-CB | CA: BC-CB | 2 |
| RP40-SP6 = BC-CB<br>RP39-SP7 = CB-BA | BC: CB-BA | BC: CB-BA | 2 |
| RP39-SP7 = CB-BA<br>RP38-SP8 = AC-AB | CB: AC-AB | CB: AC-AB | 2 |
| RP38-SP8 = AC-AB<br>RP37-SP9 = CA-BC | AC: CA-BC | | |
| RP37-SP9 = CA-BC<br>RP36-SP10 = BC-CB | CA: BC-CB | | |
| RP36-SP10 = BC-CB<br>RP35-SP11 = CB-BC | BC: CB-BC | BC: CB-BC | 1 |
| RP35-SP11 = CB-BC<br>RP34-SP12 = BC-CB | CB: BC-CB | CB: BC-CB | 1 |
| RP34-SP12 = BC-CB<br>RP33-SP13 = CB-BA | BC: CB-BA | | |
| RP33-SP13 = CB-BA<br>RP32-SP14 = AC-AB | CB: AC-AB | | |
| RP32-SP14 = AC-AB<br>RP31-SP15 = CA-BA | AC: CA-BA | AC: CA-BA | 1 |
| RP31-SP15 = CA-BA<br>RP30-SP16 = AC-AB | CA: AC-AB | | |
| RP30-SP16 = AC-AB<br>RP29-SP17 = CA-BC | AC: CA-BC | | |
| RP29-SP17 = CA-BC<br>RP28-SP18 = BC-CD | CA: BC-CD | CA: BC-CD | 1 |
| RP28-SP18 = BC-CD<br>RP27-SP19 = DB-DA | BC: DB-DA | BC: DB-DA | 1 |
| RP27-SP19 = DB-DA<br>RP26-SP20 = AD-AB | DB: AD-AB | DB: AD-AB | 1 |
| RP26-SP20 = AD-AB<br>RP25-SP21 = CA-BC | AD: CA-BC | AD: CA-BC | 1 |

FIG. 4X

Super Cooled Set - Second Group 1) 44 (total droplets in input stream)

2) 23 (number of source pucks)

3) 22 (number of reverse pucks)

4) BA (bubble scum)

5) CA-BA (starting gum drop pair)
   CA-BA *AC-AB (starting adj. gum drop pairs)

6) CA-BC (ending gum drop pair)
   AD-AB *CA-BC (ending adj. gum drop pairs)

7)    CA-BA = 2
      CA-BC = 4
      CB-BA = 2  (odd gum drop
      CB-BC = 1   pair type and count)
      DB-DA = 1

AC-AB = 4
      BC-CB = 3  (even gum drop
      BC-CD = 1   pair type and count)
      AD-AB = 1

8)    CA:AC-AB = 2
      AC:CA-BC = 3
      CA:BC-CB = 2
      BC:CB-BA = 2
      CB:AC-AB = 2
      BC:CB-BC = 1  (Adjacent gum drop
      CB:BC-CB = 1   pairs type and count)
      AC:CA-BA = 1
      CA:BC-CD = 1
      BC:BD-DA = 1
      DB:AD-AB = 1
      AD:CA-BC = 1

9)   C C
     B B
     C A  (inversion pucks)
     A B

10)   N/A  (padding droplets)

*FIG. 4Y*

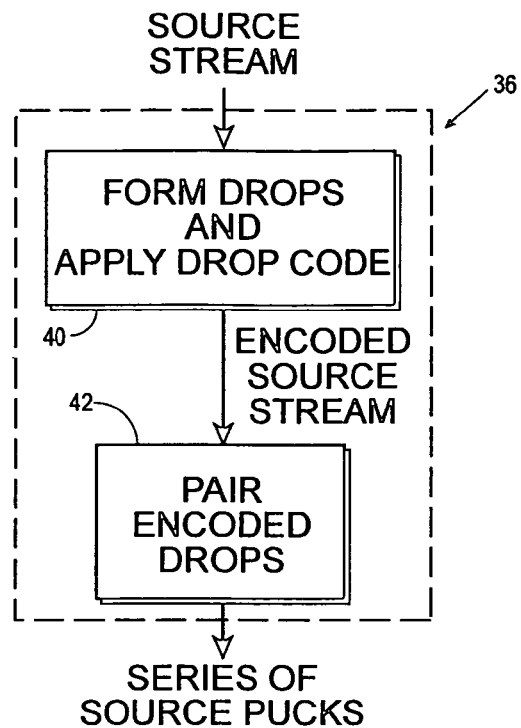
*FIG. 5*
TIER 1: 0 0 1 1
TIER 2: 0 1 0 1
ENCODING TIER 1: A B C D
ENCODING TIER 2: D C B A
*FIG. 6*
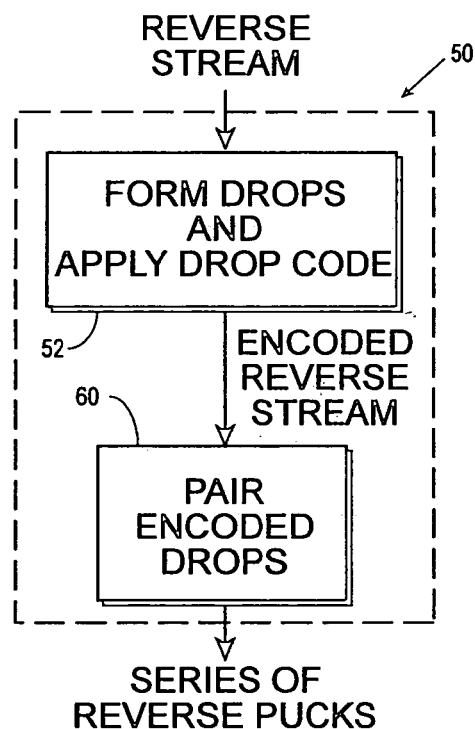
*FIG. 7*

GROUP 1: LOCK FORMATION               RESULTING LOCK

| Adjacent Gum<br>Drop Pairs Type | Count | Operation | Adjacent Gum<br>Drop Pairs Type | Count |
|---|---|---|---|---|
| 1.  AC: CA-BA | 2 | +10 | AC: CA-BA | +12 |
| 5.  BC: CB-BA | 1 | - 5 | BC: CB-BA | - 4 |
| 7.  CA: AC-AB | 4 | + 0 | CA: AC-AB | + 4 |
| 10. CB: AC-AB | 2 | + 8 | CB: AC-AB | +10 |
| 11. DA: AD-AB | 1 | - 10 | DA: AD-AB | - 9 |
| 12. DA: BD-CB | 1 | + 1 | DA: BD-CB | + 2 |

─170

GROUP 1: KEY FORMATION                RESULTING KEY

| Adjacent Gum<br>Drop Pairs Type | Count | Operation | Adjacent Gum<br>Drop Pairs Type | Count |
|---|---|---|---|---|
| 1. AC: CA-BA | 2 | - 5 | AC: CA-BA | - 3 |
| 2. AC: CA-BC | 1 | + 6 | AC: CA-BC | + 7 |
| 3. AC: DA-DA | 1 | + 9 | AC: DA-DA | + 10 |
| 4. AD: CA-BA | 1 | - 11 | AD: CA-BA | + 10 |
| 6. BD: CB-BA | 1 | + 3 | BD: CB-BA | + 4 |
| 8. CA: AC-AD | 1 | + 0 | CA: AC-AD | + 1 |
| 9. CA: BC-CB | 1 | + 7 | CA: BC-CB | + 8 |

GROUP 1: LOCK        ─170        ─174  OPEN LOCK

| Adjacent Gum Drop Pair Type | Count | Apply Combination | Adjacent Gum Drop Pair Type | Count |
|---|---|---|---|---|
| 1. AC: CA-BA | +12 | -10 | AC: CA-BA | 2 |
| 5. BC: CB-BA | -4 | +5 | BC: CB-BA | 1 |
| 7. CA: AC-AB | +4 | -0 | CA: AC-AB | 4 |
| 10. CB: AC-AB | +10 | -8 | CB: AC-AB | 2 |
| 11. DA: AD-AB | -9 | +10 | DA: AD-AB | 1 |
| 12. DA: BD-CB | +2 | -1 | DA: BD-CB | 1 |

GROUP 1: KEY                    ─172   ─174  OPEN KEY

| Adjacent Gum Drop Pair Type | Count | Apply Combination | Adjacent Gum Drop Pair Type | Count |
|---|---|---|---|---|
| 1. AC: CA-BA | -3 | +5 | AC: CA-BA | 2 |
| 2. AC: CA-BC | +7 | -6 | AC: CA-BC | 1 |
| 3. AC: DA-DA | +10 | -9 | AC: DA-DA | 1 |
| 4. AD: CA-BA | +10 | +11 | AD: CA-BA | 1 |
| 6. BD: CB-BA | +4 | -3 | BD: CB-BA | 1 |
| 8. CA: AC-AD | +1 | -0 | CA: AC-AD | 1 |
| 9. CA: BC-CB | +8 | -7 | CA: BC-CB | 1 |

GROUP 1: SUPER COOLED VALUES

| Adjacent Gum Drop Pair Type | Lock Count | Key Count | Open Box Count |
|---|---|---|---|
| 1. AC: CA-BA | 2 | 2 | 4 |
| 2. AC: CA-BC | 0 | 1 | 1 |
| 3. AC: DA-DA | 0 | 1 | 1 |
| 4. AD: CA-BA | 0 | 1 | 1 |
| 5. BC: CB-BA | 1 | 0 | 1 |
| 6. BD: CB-BA | 0 | 1 | 1 |
| 7. CA: AC-AB | 4 | 0 | 4 |
| 8. CA: AC-AD | 0 | 1 | 1 |
| 9. CA: BC-CB | 0 | 1 | 1 |
| 10. CB: AC-AB | 2 | 0 | 2 |
| 11. DA: AD-AB | 1 | 0 | 1 |
| 12. DA: BD-CB | 1 | 0 | 1 |

*FIG. 12B*

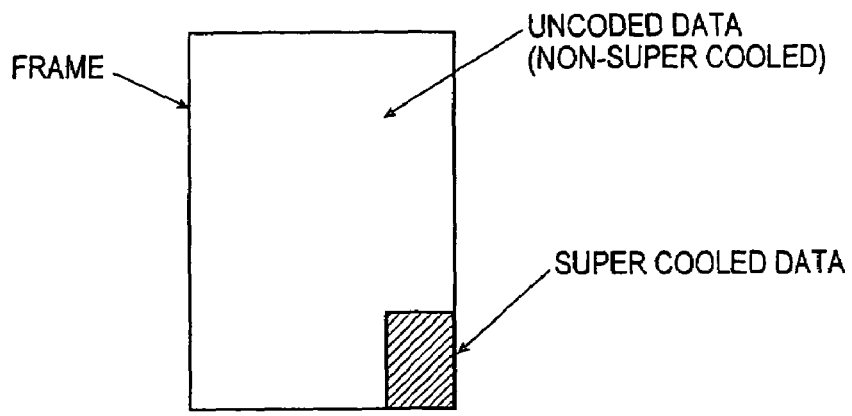

FIG. 13

MIRRORED PUCKS

| GROUP 1 | | GROUP 2 | |
|---|---|---|---|
| Rev. Top | Normal Bott. | Rev. Bott. | Normal Top |
| RP 1 = C B | SP 43 = C B | RP 43 = A A | SP 1 = C A |
| RP 2 = B D | SP 42 = D C | RP 42 = B A | SP 2 = A C |
| RP 3 = D A | SP 41 = A D | RP 41 = A B | SP 3 = C A |
| RP 4 = A C | SP 40 = B A | RP 40 = D A | SP 4 = A D |
| RP 5 = C A | SP 39 = A B | RP 39 = A D | SP 5 = D A |
| RP 6 = A D | SP 38 = D A | RP 38 = B A | SP 6 = A C |
| RP 7 = D A | SP 37 = A D | RP 37 = A B | SP 7 = C A |
| RP 8 = A C | SP 36 = B A | RP 36 = D A | SP 8 = A D |
| RP 9 = C A | SP 35 = A B | RP 35 = A D | SP 9 = D A |
| RP 10 = A C | SP 34 = B A | RP 34 = D A | SP 10 = A D |
| RP 11 = C A | SP 33 = A B | RP 33 = A D | SP 11 = D A |
| RP 12 = A C | SP 32 = B A | RP 32 = B A | SP 12 = A C |
| RP 13 = C B | SP 31 = C B | RP 31 = A B | SP 13 = C A |
| RP 14 = B C | SP 30 = B C | RP 30 = B A | SP 14 = A C |
| RP 15 = C A | SP 29 = A B | RP 29 = A B | SP 15 = C A |
| RP 16 = A C | SP 28 = B A | RP 28 = D A | SP 16 = A D |
| RP 17 = C A | SP 27 = A B | RP 27 = C D | SP 17 = D B |
| RP 18 = A C | SP 26 = B A | RP 26 = B C | SP 18 = B C |
| RP 19 = C A | SP 25 = A B | RP 25 = A B | SP 19 = C A |
| RP 20 = A C | SP 24 = B A | RP 24 = D A | SP 20 = A D |
| RP 21 = C A | SP 23 = A B | RP 23 = C D | SP 21 = D B |
| RP 22 = A C | SP 22 = B A | | |

FIG. 14

METHOD FOR ENCODING DATA

CROSS-REFERENCE TO RELATED APPLICATIONS

The present application claims priority to the provisional application identified by the U.S. Ser. No. 60/687,604, filed on Jun. 3, 2005, the entire content of which is hereby expressly incorporated herein by reference.

STATEMENT REGARDING FEDERALLY SPONSORED RESEARCH OR DEVELOPMENT

Not applicable.

BACKGROUND OF THE INVENTION

In general, data encoding involves the process of representing information using fewer data units or bits than a more direct representation would require. While various algorithms and techniques have been developed for encoding data, there is a continuing need for an effective and readily implemented encoding method. It is to such methods, and systems implementing the same, that the present invention is directed.

BRIEF DESCRIPTION OF THE DRAWINGS

FIGS. 4A-4Y cooperate to illustrate the method for encoding data for an exemplary input stream, more particularly.

FIG. 4A shows an exemplary input stream.

FIG. 4B shows an exemplary rippled input stream.

FIG. 4C shows an exemplary rotated rippled input stream generated in the formation of an exemplary source stream.

FIG. 4D shows the rotated rippled input stream of FIG. 4C with an added end droplet so as to form the exemplary source stream.

FIG. 4E shows a formation of an exemplary encoded source stream from the source stream of FIG. 4D.

FIG. 4F shows a formation of an exemplary series of source pucks from the exemplary encoded source stream of FIG. 4E.

FIG. 4G shows the series of source pucks from FIG. 4F.

FIG. 4H shows an exemplary rotated duplicate rippled stream generated in the formation of an exemplary reverse stream.

FIG. 4I shows an exemplary reversed, rotated duplicate rippled stream generated in the formation of the exemplary reverse stream.

FIG. 4J shows the reversed, rotated duplicate rippled stream of FIG. 4I with an added end droplet so as to form the exemplary reverse stream.

FIG. 4K shows a formation of an exemplary encoded reverse stream from the reverse stream of FIG. 4J.

FIG. 4L shows a formation of an exemplary series of reverse pucks from the exemplary encoded reverse stream of FIG. 4K.

FIG. 4M shows the series of reverse pucks from FIG. 4L.

FIG. 4N shows an exemplary first group formed from a portion of the series of source pucks of FIG. 4G and a portion of the series of reverse pucks of FIG. 4M.

FIG. 4O shows an exemplary second group formed from a portion of the series of source pucks of FIG. 4G and a portion of the series of reverse pucks of FIG. 4M.

FIG. 4P shows an exemplary first group bubble formed from the first group of FIG. 4N.

FIG. 4Q shows an exemplary set of gum drop pairs formed from the first group bubble of FIG. 4P.

FIG. 4R shows an exemplary set of gum drop pair types and counts for odd and even gum drop pairs of FIG. 4Q.

FIG. 4S shows an exemplary set of adjacent gum drop pairs formed from the first group bubble of FIG. 4P, and an exemplary set of adjacent gum drop pairs types and counts for the adjacent gum drop pairs.

FIG. 4T shows an exemplary super cooled set for the first group of FIG. 4N.

FIG. 4U shows an exemplary second group bubble formed from the second group of FIG. 4O.

FIG. 4V shows an exemplary set of gum drop pairs formed from the second group bubble of FIG. 4U.

FIG. 4W shows an exemplary set of gum drop pair types and counts for odd and even gum drop pairs of FIG. 4V.

FIG. 4X shows an exemplary set of adjacent gum drop pairs formed from the second group bubble of FIG. 4U, and an exemplary set of adjacent gum drop pairs types and counts for the adjacent gum drop pairs.

FIG. 4Y shows an exemplary super cooled set for the second group of FIG. 4O.

FIG. 5 shows a flow chart illustrating one embodiment of an encoding subroutine for forming the series of source pucks in accordance with the present invention.

FIG. 6 shows one embodiment of a two tier encoding scheme.

FIG. 7 shows a flow chart illustrating one embodiment of an encoding subroutine for forming the series of reverse pucks in accordance with the present invention.

FIG. 8 shows an exemplary first group and an exemplary second group having two inversion duets.

FIG. 12A shows a formation of an exemplary lock component and an exemplary key component for the first group in accordance with the present invention.

FIG. 12B shows an exemplary combination applied to the lock component and the key component of FIG. 12A, and the resulting set of adjacent gum drop pair types and count for the first group.

FIG. 13 shows a block diagram illustrating a frame constructed in accordance with the present invention.

FIG. 14 shows an exemplary first group and second group having mirrored pucks.

FIG. 16A shows the transformation of the subset of duets into DNA pairs. FIG. 16B shows a flow chart illustrating the transformation process and the transformation of an exemplary first duet as the transformation process is applied.

DETAILED DESCRIPTION OF THE INVENTION

The term "encoding", and derivations thereof, as used herein generally refers to the process by which a set of data units are represented in a different form, for example for the purpose of storing or transmitting the data units; and the term "decoding", and derivations thereof, as used herein generally refers to the process of restoring a compressed set of data units to its normal or original form, for example for the purpose of processing, displaying or otherwise using the data units.

Figure 1:
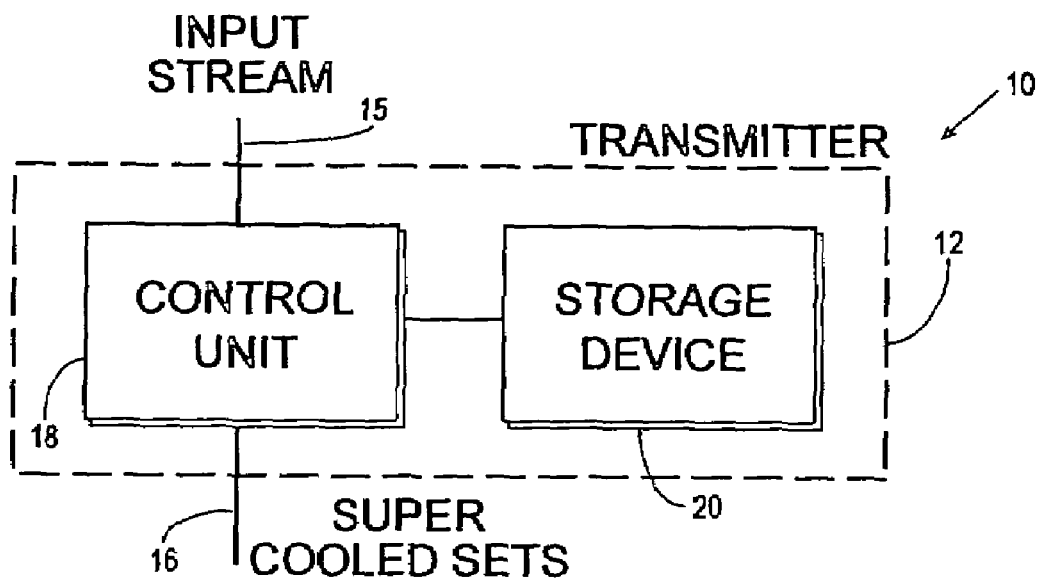
FIG. 1 shows a block diagram of a system for encoding data, which is constructed in accordance with the present invention.
Figure 2:
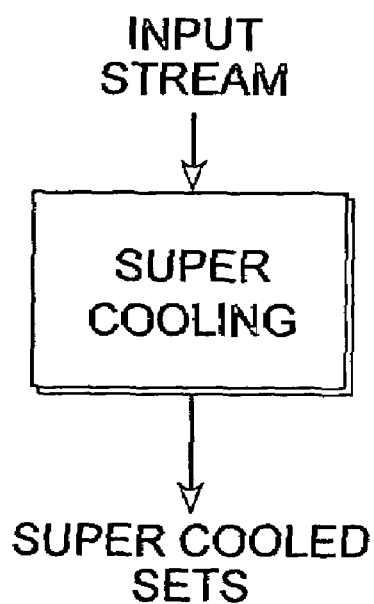
FIG. 2 shows a flow chart illustrating a general method for encoding data in accordance with the present invention.

Referring now to the drawings, and in particular to FIGS. 1 and 2. Shown in FIG. 1 and designated therein by a reference numeral 10 is a system for data encoding, and shown in FIG. 2 is a general method for data encoding which is preformed by the system 10.

The novel encoding process of the present invention is referred to herein by the Applicant by the term "super cooling". In general, during the super cooling process, a stream of data units, which is referred to herein as an "input stream", is manipulated, encoded and summarized to form entities that represent the input stream in a different form. This representative form of the original input stream is referred to herein as "super cooled sets". The super cooled sets can be used for example for the transmission and/or storage of the information contained within the input stream.

In one embodiment, the system 10 includes a control unit 18. The control unit 18 can be any computational device capable of executing the super cooling process or logic. In one embodiment, the control unit 18 executes a super cooling program contained in a storage device 20. The storage device 20, which can be for example a read-only memory device, stores the program code and commands required for operation by the control unit 18 in performing the super cooling process on the input stream. Alternately, the super cooling process may be incorporated into the control unit 18 itself.

Figure 3:
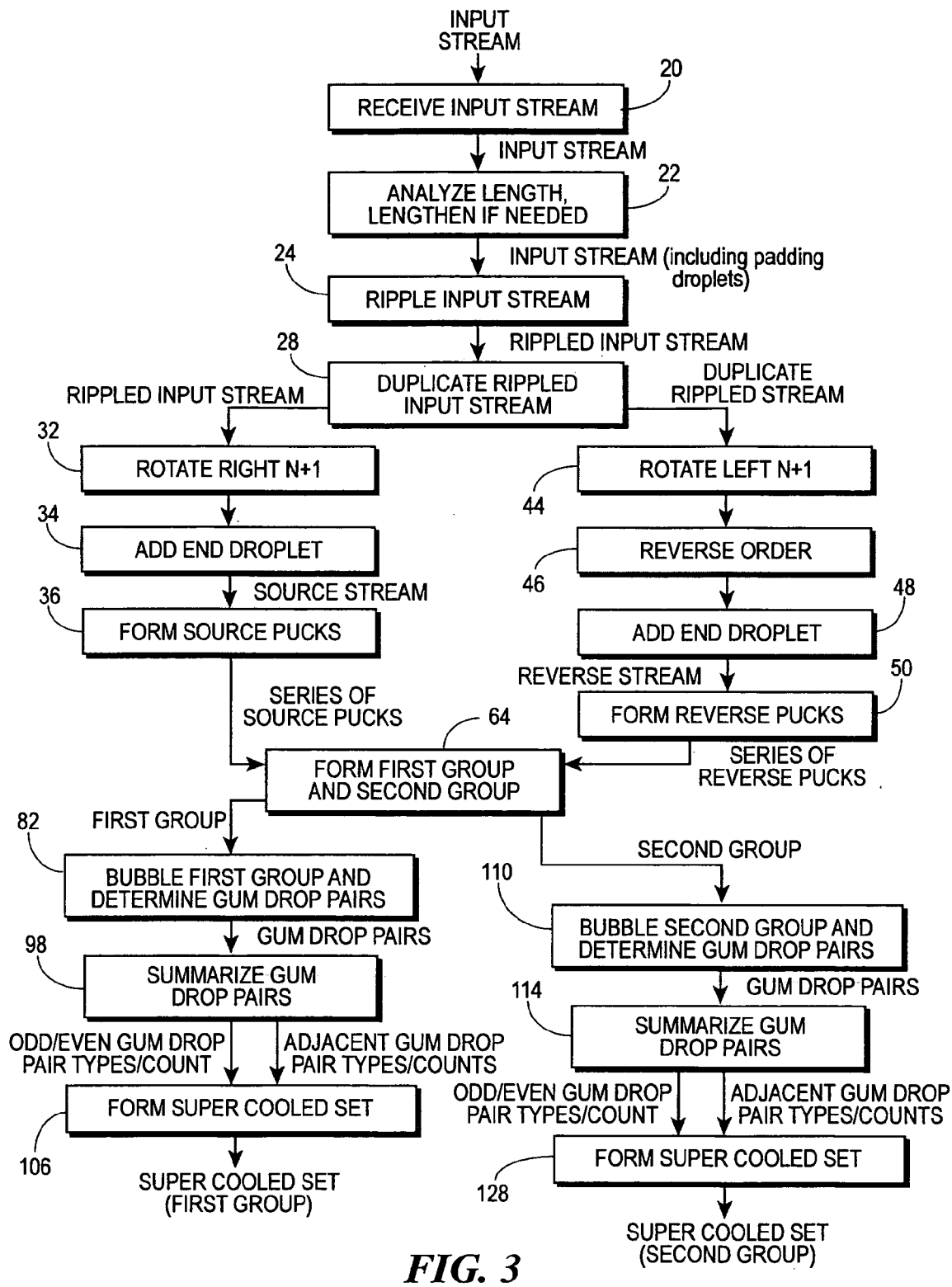
FIG. 3 is a flow chart illustrating one embodiment of a method for encoding data in accordance with the present invention.
Figures 4A, 4B, 4C, 4D, 4E, 4F:
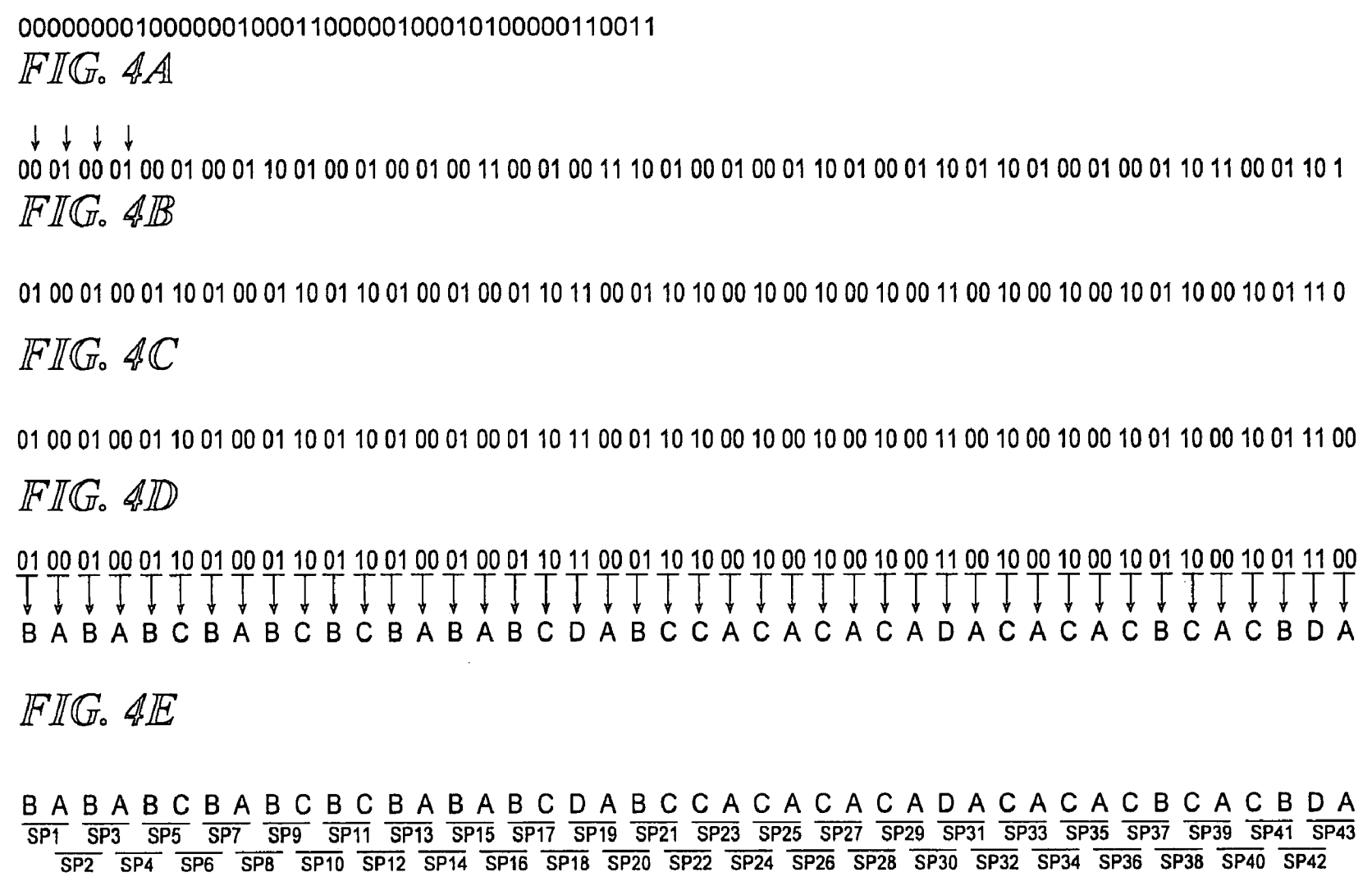

With reference now to FIG. 3, the operation of the control unit 18, i.e., the performing of the super cooling process, will now be described. At a step 20, the control unit 18 receives or reads the input stream. The input stream comprises a plurality of sequential binary data units or bits, i.e. 1's and 0's. The individual data units of the input stream are generally referred to herein by the Applicant by the term "droplets." For example, shown in FIG. 4A is an exemplary input stream which is used herein for purposes of discussion and clarity of understanding, and to illustrate the various steps of the super cooling process to achieve the final super cooled sets (as shown in FIGS. 4B-4Y). For the exemplary input stream of FIG. 4A, there are forty-four droplets.

Once the input stream is received, the control unit 18 branches to a step 22 where the length of the input stream is analyzed, and lengthened if needed. To perform the super cooling process of the present invention, though not mandatory, it is advantageous for the total number of droplets or length of the input stream to be an odd multiple of the number four (e.g., 3×4=12, 5×4=20, 11×4=44, etc.). Therefore, if the input stream does not have a length that is an odd multiple of the number four, in the step 22 one or more data units or binary streams which Applicant refers to herein as "padding droplets," or collectively as "after spray," are concatenated or added to the end of the input stream to meet this requirement. The values of the padding droplets are arbitrary, however the padding droplets have to be identified as being extraneous to the input stream. For purposes of discussion and clarity of understanding, any padding droplets that are added to the input stream are considered as part of the input stream in the discussion that follows. (Note that in the example shown in FIG. 4A, the exemplary input stream contains forty-four droplets which is an odd multiple of four, and thus no padding droplets are required.)

Within the input stream, there is the possibility that there will be a sequence of consecutive droplets which are repeated, i.e., which have the same value. When there is a sequence of greater than three droplets of the same value, the sequence is referred to herein as a "run." Runs can negatively affect the super cooling process of the present invention by causing ambiguities and anomalies. As such, it is desirable to break up any runs that may exist in the input stream. Therefore, after the step 22, the control unit 18 branches to a step 24, wherein additional droplets are introduced into the input stream in a pre-determined sequence. This step 24 is referred to herein by the Applicant as "rippling" (or derivations thereof) and the additional droplets are referred to herein as "ripple droplets." Rippling of the input stream forms what is referred to herein as a "rippled input stream."

There are different ways to perform the rippling step 24. In one embodiment, the rippling step 24 comprises introducing a ripple droplet after each consecutive input stream droplet, except the last droplet, wherein the ripple droplets are alternated in value as each ripple droplet is inserted into the input stream. In such an embodiment, the rippling can be either "0-1 rippling" or "1-0 rippling." For 0-1 rippling, the first ripple droplet introduced is a zero, the second ripple droplet is a one, the third ripple droplet is a zero, and so on. For 1-0 rippling, the first ripple droplet introduced into the input stream is a one, the second ripple droplet is a zero, the third ripple droplet is a one, and so on.

For example, shown in FIG. 4B is the exemplary input stream of FIG. 4A with 0-1 rippling, which results in eighty-seven droplets. The first four ripple droplets in the rippled input stream of FIG. 4B are indicated by a downward arrow over each ripple droplet for purposes of illustration.

Once the rippled input stream is achieved, the control unit 18 branches to a step 28, wherein a duplicate of the rippled input stream is generated, which is referred to herein by the Applicant by the term "duplicate rippled stream".

At this point, the rippled input stream and the duplicate rippled stream are each provided as an input to different sets of logic. The rippled input stream will be discussed first for purposes of clarity of understanding. However, it should be understood that the logic for the rippled input stream and the logic for the duplicate rippled stream can be performed in any order or simultaneously. In other words, it should be understood that various steps of the super cooling process that lend themselves to be performed in other orders or in parallel can be implemented as such to shorten the execution time of the present invention.

For the rippled input stream, the control unit 18 branches to a step 32 wherein the rippled input stream is "rotated to the right" such that each of the droplets in the rippled input stream is shifted a position to the right, and the right-most droplet is looped to or deposited in the left-most position which is vacated. In one preferred embodiment, the rippled input stream is rotated to the right by N+1 droplets, where N is the total number of droplets in the input stream (including any padding droplets). As such, it can be seen that the relative ordering of the droplets is generally preserved, however the start (or first) droplet and the end (or last) droplet in the stream are different. For example, shown in FIG. 4C is the exemplary rippled input stream of FIG. 4B rotated to the right by 44+1 or 45 droplets.

The control unit 18 then branches to a step 34, wherein a final end droplet is added to the end of the rotated rippled input stream so as to form an even number of droplets. In one embodiment, the final end droplet is set equal to the first droplet of the rotated rippled input stream to make the total count of droplets even. For example, shown in FIG. 4D is the rotated rippled input stream of FIG. 4C with the final end droplet having a value of "0" added at the end. The resulting stream of the steps 32 and 34 is referred to herein as a "source stream."

It should be understood that while the super cooling process is described in one embodiment as "rotating" droplets when forming the source stream, the source stream can be equivalently generated by defining a starting offset at which to begin forming the source stream from the droplets of the rippled input stream. If the first droplet in the rippled input stream is considered to have an offset of zero, then the starting offset should be defined to be N−2, where N is the length of the input stream (including any padding droplets). For example, for the rippled input stream of FIG. 4B, the starting offset would be defined as 44−2 or 42. Therefore, the droplet at offset 42 (with the first droplet of the rippled input stream being at offset zero) would be the first droplet of the source stream. Then the succeeding droplets of the rippled input stream would be put in the source stream until the end of the rippled input stream is reached, and then continue on to the beginning of the rippled input stream until the droplet at offset 41 is reached. Then the final end droplet can be added to the end so as to form an even number of droplets in the source stream.

Once the source stream is generated in the steps 32 and 34, the control unit 18 branches to an encoding subroutine, which shown in FIG. 3 as a step 36, wherein the droplets of the source stream are formed into representative entities referred to herein by the Applicant by the term "pucks" or "drop pairs". Because the pucks are formed from the source stream at this point, the pucks are more specifically referred to herein by the Applicant by the term "source pucks."

For purposes of clarity of understanding the scheme for formation of the pucks, an interim step is gone through in the encoding subroutine 36. The encoding subroutine 36 is shown in more detail in FIG. 5. In a step 40 of the encoding subroutine 36, the control unit 18 takes two consecutive (side-by-side) and unique droplets in the source stream to form a pairing which is referred to herein as a "drop", and then assigns to each drop a predetermined symbol according to the values of the droplets in the drop. The plurality of encoded drops collectively form an encoded source stream comprising a plurality of symbols which represent the droplets of the source stream.

The collective group of predetermined symbols used to encode the drops of the source stream are referred to herein as a "drop code." Since the drops are formed from two consecutive droplets and the droplets are binary in nature, there are four possible drop combinations: 00, 01, 10, and 11. In one embodiment, the first four letters of the alphabet are the predetermined symbols, wherein the letter "A" is assigned to a drop having the value 00; the letter "B" is assigned to a drop having the value 01; the letter "C" is assigned to a drop having the value 10; and the letter "D" is assigned to a drop having the value 11.

For example, shown in FIG. 4E is the source stream of FIG. 4D wherein the droplets of the source stream have been paired in groups of two to form drops (as indicated by a horizontal line under each drop) and then the encoded source stream resulting from application of the drop code to each fo the drops (wherein each resulting encoded drop is indicated by a vertical down arrow under its corresponding drop). The source stream is thereby converted from a binary stream to a quad stream.

While the predetermined symbols of the drop code have been described herein as being A, B, C, and D by way of illustration, it should be understood by those skilled in the art that this particular designation is arbitrary and that any distinct letter or other symbol may be chosen to represent one of the four drop combinations. For example, the letters W, X, Y, Z; the letters A, C, G, T; the letters P, M, C, Q; the letters G, K, A, R; etc., could be used to represent the four drop combinations.

Also, the present invention contemplates the utilization of two equivalent types of encoding: "single tier" encoding and "two tier" encoding. It can be seen that the droplets of the rippled input stream can be assigned as an "even" droplet or an "odd" droplet, depending on its position in the data stream. For example, if the first or leftmost droplet is considered an even droplet, the next consecutive droplet would be an odd droplet, and the next consecutive droplet would be an even droplet, and so on. When the rippled input stream's even and odd droplets are taken together in one sequential series, or in one tier, when applying the drop code, as generally discussed above, the encoding is termed herein by the Applicant as single tier encoding. However, when the rippled input stream's even and odd droplets are separated into two series or tiers before applying the drop code, the encoding process is termed herein by the Applicant as two tier encoding.

To encode the two tiers, the drops are still formed by taking one even droplet and one odd droplet (from the first and second tiers, respectively). However, two letters are assigned to each possible combination of droplets, i.e., 00, 01, 10, and 11. Then which of the two letters to be assigned to a droplet is dependent on whether the encoding is being performed on the first tier or the second tier. For example, shown in FIG. 6 and taking the exemplary drop code discussed above of A, B, C and D, the possible combinations for two tier encoding is given. The first tier is encoded by assigning the value "00" (given by a "0" even droplet from the first tier and a "0" odd droplet from the second tier) the letter "A"; while for encoding the second tier, the value "00" is assigned the letter "D". For encoding the first tier, the value "01" (given by a "0" even droplet from the first tier and a "1" odd droplet from the second tier) is assigned the letter "B"; while for encoding the second tier, the value "01" is assigned the letter "C". For encoding the first tier, the value "10" (given by a "1" even droplet from the first tier and a "0" odd droplet from the second tier) is assigned the letter "C"; while for encoding the second tier, the value "10" is assigned the "B". For encoding the first tier, the value "11" (given by a "1" even droplet from the first tier and a "1" odd droplet from the second tier) is assigned the letter "D"; while for encoding the second tier, the value "11" is assigned the letter "A".

As shown in FIG. 5, once the source code has been encoded, the control unit 18 branches to a step 42 of the encoding subroutine 36. In the step 42, the plurality of symbols of the encoded source stream are then paired to form a series of source pucks. As a result of the pairing, each source puck includes two consecutive symbols or drops of the encoded source stream. However, the symbols are not unique to only one source puck. The series of source pucks include overlapping symbols between adjacent source pucks in that a succeeding source puck in the series of source pucks will included as its first (or left) drop the second (or right) drop of a preceding source puck; and each preceding source puck will include as its second (or right) drop the first (or left) drop of a succeeding source puck. Thus, it can be seen that the first puck in the series of source pucks (which does not succeed another source puck) will only have one "overlapping" drop (its right drop) with one other source puck in the series of source pucks; and the last puck in the series of source pucks (which does not precede another source puck) will only have one "overlapping" drop (its left drop) with one other source puck in the series of source pucks.

For example, shown in FIG. 4F is the encoded source stream of FIG. 4E wherein the encoded drops of the encoded source stream have been paired to form source pucks (as indicated by alternating horizontal lines below the pairings of encoded drops). The source pucks are further identified in FIG. 4F by an alphanumeric identifier having the prefix "SP" located under each source puck. Also, for purposes of further discussion herein, each of the source pucks of FIG. 4F, and its corresponding alphanumeric identifier, is shown in series in FIG. 4G. As can be seen, the pairing step 42 of the encoding subroutine 36 should result in an odd number of source pucks.

For the duplicate rippled stream discussed above, the control unit 18 branches to a step 44, as shown in FIG. 3. In step 44, the duplicate rippled stream is "rotated to the left" such that each of the droplets in the duplicate rippled stream is shifted a position to the left, and the left-most droplet is looped to the right-most position which is vacated. The duplicate rippled stream is rotated to the left to the same degree that the rippled input stream is rotated to the right during formation of the source stream (e.g., by N+1 droplets). For example, shown in FIG. 4H is the duplicate rippled stream (which is a duplicate of the rippled input stream shown in FIG. 4B) which is rotated to the left by 44+1 or 45 droplets.

The control unit then branches to a step 46, wherein the droplets of the rotated duplicate rippled stream are reversed in order. For example, shown in FIG. 4I is the rotated duplicate rippled stream of FIG. 4H which has been reversed in order. The droplets of the rotated duplicated rippled stream can be reversed in order by rotating the droplets or by defining a starting offset, in a similar manner as discussed above with reference to the source stream. The control unit 18 then branches to a step 48, wherein a final end droplet is added to the end of the rotated and reversed duplicate rippled stream. In one embodiment, the final end droplet is equal to the first droplet of the rotated and reversed duplicate rippled stream to make the total count of droplets even. The resulting stream of the steps 44, 46 and 48 is referred to herein as a "reverse stream."

Similar to the source stream, it should be understood that while the super cooling process is described in one embodiment as "rotating" droplets to form the reverse stream, the reverse stream can be equivalently generated by defining a starting offset at which to begin forming a pre-reversal stream from which the reverse stream is generated. If the first droplet in the duplicate rippled stream is considered to have an offset of zero, then the starting offset should be defined to be N+1, where N is the length of the input stream (including any padding droplets). For example, for the duplicate rippled stream which is duplicated from the rippled input stream of FIG. 4B, the starting offset would be defined as 44+1 or 45. Therefore, the droplet at offset 45 (with the first droplet of the duplicate rippled stream being at offset zero) would be the first droplet of the pre-reversal stream. Then the succeeding droplets of the duplicate rippled stream would be taken in reverse order and put in the reversal stream until the beginning of the duplicate rippled stream is reached, and then continue on to the end of the duplicate rippled stream until the droplet at offset 45 is reached. This accomplishes the same end result to obtain the reverse stream without the need to from the duplicate rippled stream, rotating it left and then reversing it.

Once the reverse stream is generated in the steps 44, 46 and 48, the control unit 18 branches to an encoding subroutine, which is shown in FIG. 3 as a step 50. The encoding subroutine 50 for the reverse stream is similar to the encoding subroutine 36 discussed above with reference to the source stream. Therefore, for purposes of brevity, the encoding subroutine 50 for the reverse stream is discussed summarily below.

For purposes of clarity of understanding the scheme for formation of the pucks, an interim step is gone through in the encoding subroutine 50. The encoding subroutine 50 for the reverse stream is shown in more detail in FIG. 7. At a step 52, the plurality of droplets of the reverse stream are paired to form drops, and each drop is assigned a predetermined symbol according to the values of the droplets in the drop so as to form an encoded reverse stream comprising a plurality of symbols. Preferably, the drop code used to form the encoded reverse stream is the same as the drop code used to form the encoded source stream (e.g. A, B, C, and D). For example, shown in FIG. 4K is the reverse stream of FIG. 4J wherein the droplets of the reverse stream have been paired to form drops (as indicated by a horizontal line under each drop) and then the encoded reverse stream resulting from application of the drop code to each of the drops (wherein each resulting encoded drop is indicated by a vertical down arrow under its corresponding drop). The reverse stream is thereby converted from a binary stream to a auad stream.

Once the drops of the reverse stream are encoded, the control unit 18 branches to a step 60 of the encoding subroutine 50, wherein the plurality of drops or symbols of the encoded reverse stream are paired so as to form a series of pucks in a similar manner as discussed above for the formation of the source pucks. However, since the pucks are formed from the reverse stream in the steps 52 and 60, the pucks are specifically referred to herein by the Applicant by the term "reverse pucks."

Each reverse puck includes two consecutive drops of the encoded reverse stream, wherein the series of reverse pucks include overlapping drops between adjacent reverse pucks in that a succeeding reverse puck in the series of reverse pucks will include as its first (or left) drop the second (or right) drop of a preceding reverse puck, and each preceding reverse puck will include as its second (or right) drop the first (or left) drop of a succeeding reverse puck. For example, shown in FIG. 4L is the encoded reverse stream of FIG. 4K wherein the encoded drops of the reverse stream have been paired to form reverse pucks (as indicated by alternating horizontal lines under the pairings of encoded drops). The reverse pucks are further identified in FIG. 4L by an alphanumeric identifier having the prefix "RP" located under each reverse puck. Also, for purposes of further discussion herein, each of the reverse pucks of FIG. 4L, and its corresponding alphanumeric identifier, is shown in series in FIG. 4M. As can be seen, the pairing step 60 of the encoding subroutine 50 should also result in an odd number of reverse pucks (which is also equal to the number of source pucks in the series of source pucks).

Figure 4G:
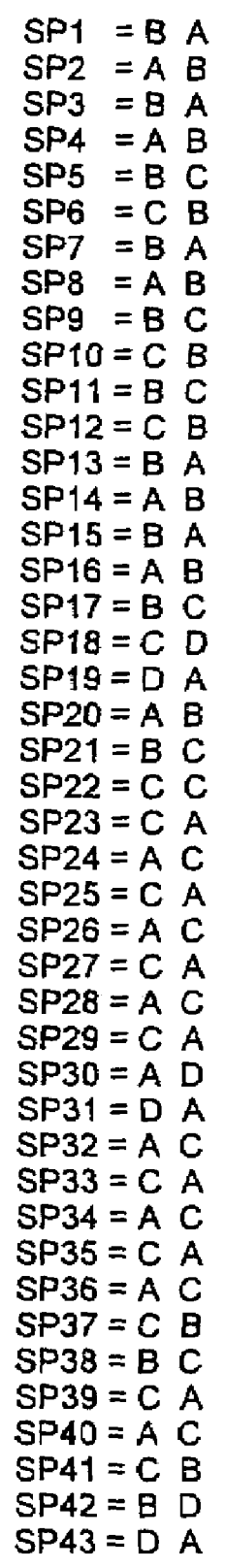

It should be noted that every puck in the series of source pucks shown in FIG. 4G has two symbols which are different from each other except generally one, which is located about the middle of the series of source pucks. The same is true for the series of reverse pucks shown in FIG.

Figures 4M, 4N, 4O:
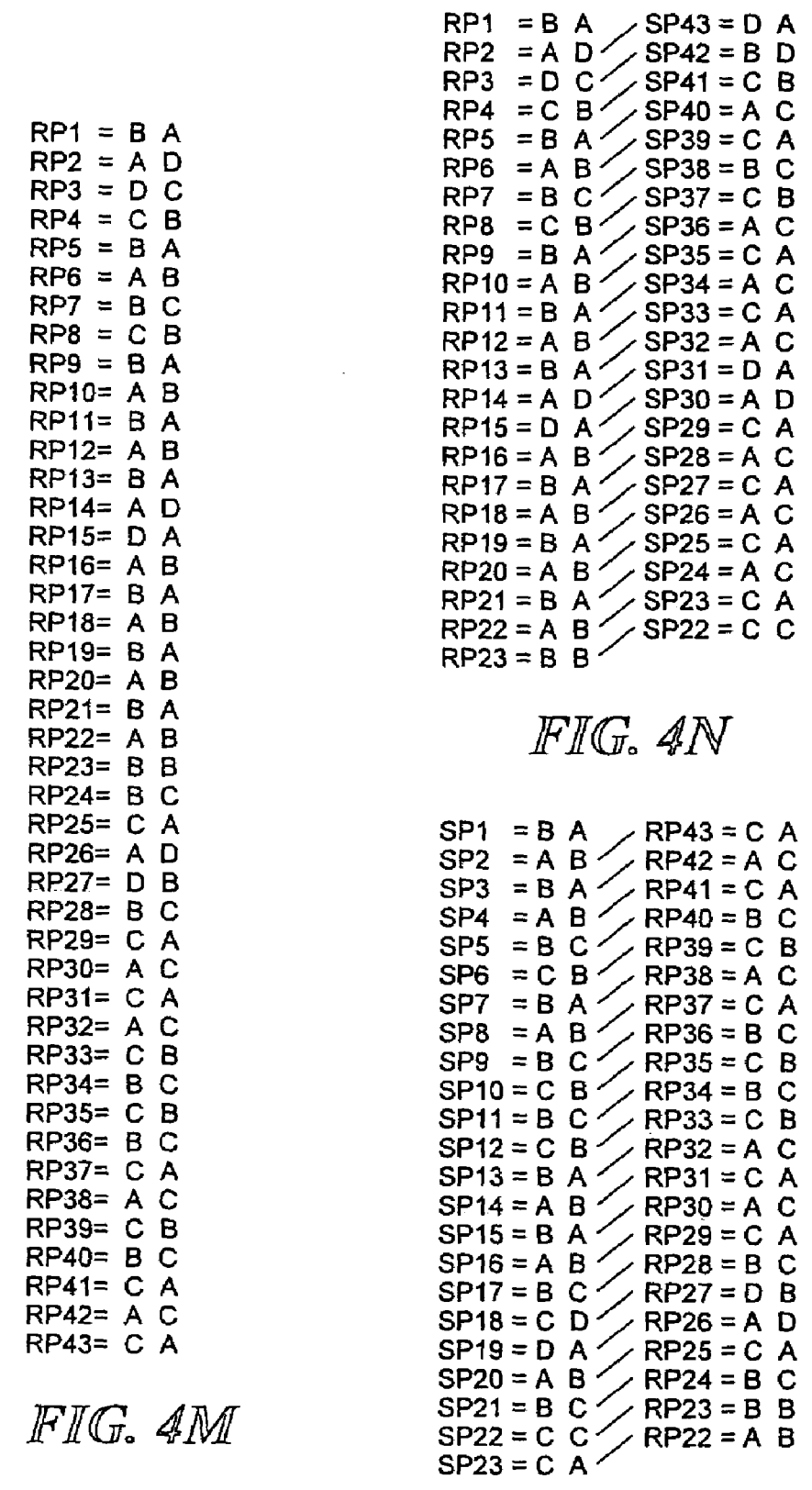

4M. The source puck and the reverse puck which have two symbols that are equal or the same symbol are referred to herein by Applicant as an "inversion puck" or "middle puck." For example, the inversion puck in FIG. 4G is the source puck identified by the alphanumeric identifier "SP22", which has a value of CC, and the inversion puck in FIG. 4M is the reverse puck identified by the alphanumeric identifier "RP23", which has a value of BB.

It should be noted that while generally only one inversion puck will exist in the series of source pucks and in the series of reverse pucks, there are situations in which more than one inversion puck will exist in the series of source pucks and in the series of reverse pucks, depending on the number of droplets in the input stream. This is shown by way of example in FIG. 8, wherein the series of source pucks and the series of reverse pucks shown therein have been formed in the manner discussed above for another exemplary input stream, which is equivalent to only the first thirty-six droplets of the exemplary input stream shown in FIG. 4A.

Figure 8:
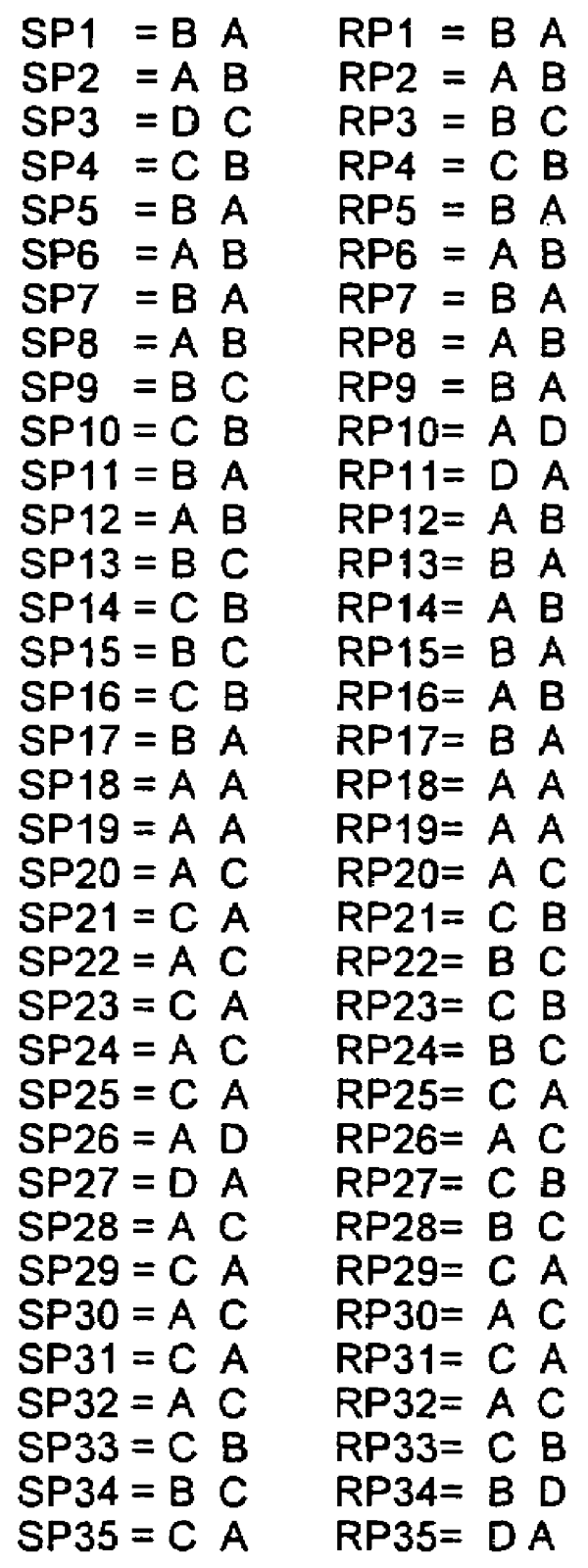

It can be seen in FIG. 8 that in the series of source pucks, there are now two inversion pucks, and in the series of reverse pucks there are now two inversion pucks. To account for or anticipate for the possibility of such occurrences, the super cooling process in one embodiment assigns two pucks as inversion pucks, regardless of whether there are two pucks that have two symbols which are the same. When there are two pucks, each of which have two symbols which are the same, the two pucks are assigned as the inversion pucks. For example, in FIG. 8, the two inversion pucks in the series of source pucks will be the source pucks labeled as "SP18" and "SP19", and the two inversion pucks in the series of reverse pucks will be the reverse pucks labeled as "RP18" and "RP19". However, when only one puck exists which has two symbols which are the same, which is referred to herein as a "true inversion puck", it is assigned as one of the inversion pucks. Then for the series of source pucks, the source puck which succeeds the true inversion puck in the series will be assigned as the second inversion puck for the series of source pucks. For the series of reverse pucks, the reverse puck which precedes the true inversion puck in the series will be assigned as the second inversion puck for the series of reverse pucks. For example, in FIG. 4G, the two inversion pucks will be the source puck labeled as "SP22" (which is the true inversion puck) and the source puck labeled as "SP23" which succeeds it; and in FIG. 4M, the two inversion pucks will be the reverse puck labeled as "RP23" (which is the true inversion puck) and the reverse puck labeled as "RP22" which precedes it.

It can further be seen that when segments of the series of source pucks and segments of the series of reverse pucks are analyzed in a side-by-side comparison, there is a correspondence between the series of source pucks and the series of reverse pucks. In the comparison, each of the series of source pucks and the series of reverse pucks are first separated into two segments, which are referred to herein as a "top half" and a "bottom half." The segments are generally formed about the inversion pucks. The top half of the series of source pucks includes the inversion pucks and the source pucks that precede the inversion pucks. The bottom half of the series of source pucks includes the inversion pucks and the source pucks that succeed the inversion pucks. Likewise, the top half of the series of reverse pucks includes the inversion pucks and the reverse pucks that precede the inversion puck, and the bottom half of the series of reverse pucks includes the inversion pucks and the reverse pucks that succeed the inversion pucks.

As shown for example in FIG. 4N, when the top half of reverse pucks of FIG. 4M is grouped with the bottom half of the source pucks of FIG. 4G taken in reverse order so as to allow for a side-by-side comparison, it can be seen that generally each reverse puck (with the exception of the first reverse puck) in the top half of reverse pucks has a value which is the reverse of the value of a source puck located in a preceding position in the reverse ordered, bottom half of source pucks. (The precedential relationship between the reverse pucks in the top half of reverse pucks and the source pucks in the reverse ordered, bottom half of source pucks is indicated in FIG. 4N by slanted lines drawn therebetween). In other words, it can be seen that the symbols of each reverse puck represents binary values which are the reverse of the binary values represented by the symbols of the corresponding precedential source puck.

Consider for example the embodiment discussed above wherein the drop code utilized to generate the source pucks and reverse pucks included the symbol A to represent the binary values 00. Those values in reverse are still 00 and therefore the symbol A would again be used to represent that reversal of values. Likewise, the symbol D represents the binary values 11. Those values in reverse are still 11 and therefore the symbol D would again be used to represent that reversal of values. However, the symbol B represents the binary values 01. Those values in reverse are now 10 and therefore a different symbol, symbol C, would be used to represent that reversal of values. Likewise, the symbol C represents the binary values 10. Those values in reverse are now 01 and therefore a different symbol, symbol B, would be used to represent that reversal of values.

Now in the case of the pucks, if for example the reverse puck includes the symbols AD, which represents 0011 (as for RP2), the corresponding preceding source puck represents the reverse of those binary values which is 1100 or the symbols DA (as for SP43). As another example, if the reverse puck includes the symbols DC, which represents 1110 (as for RP3), the corresponding preceding source puck represents the reverse of those binary values, which is 0111 or the symbols BD (as for SP42). As yet another example, if the reverse puck includes the symbols CB, which represents 1001 (as for RP4), the corresponding preceeding puck represents the reverse of those binary values, which is 1001 or the symbols CB (as for SP41).

Likewise, there is also a reverse correspondence between the "top half" of the source pucks and the "bottom half" of the reverse pucks taken in reverse order. In other words, when the top half of the source pucks and the bottom half of the reverse pucks taken in reverse order are grouped together and analyzed in a side-by-side comparison, a reverse correspondence exists in that the symbols of each source puck represents binary values which are the reverse of the binary values represented by the symbols of a corresponding precedential reverse puck. For example in FIG. 4O is the top half of source pucks of FIG. 4G grouped with the bottom half of the reverse pucks of FIG. 4M taken in reverse order. (The precedential relationship between the source pucks in the top half of source pucks and the reverse pucks in the reverse ordered, bottom half of reverse pucks is indicated in FIG. 4O by slanted lines drawn therebetween).

To exploit these reverse relationships, the control unit 18 branches to a grouping subroutine, which is shown in FIG. 3 as a step 64, wherein the series of source pucks resulting from the step 36 and the series of reverse pucks resulting from step 50 discussed above are segmented, reordered and grouped to form a first group and a second group.

Figure 9:
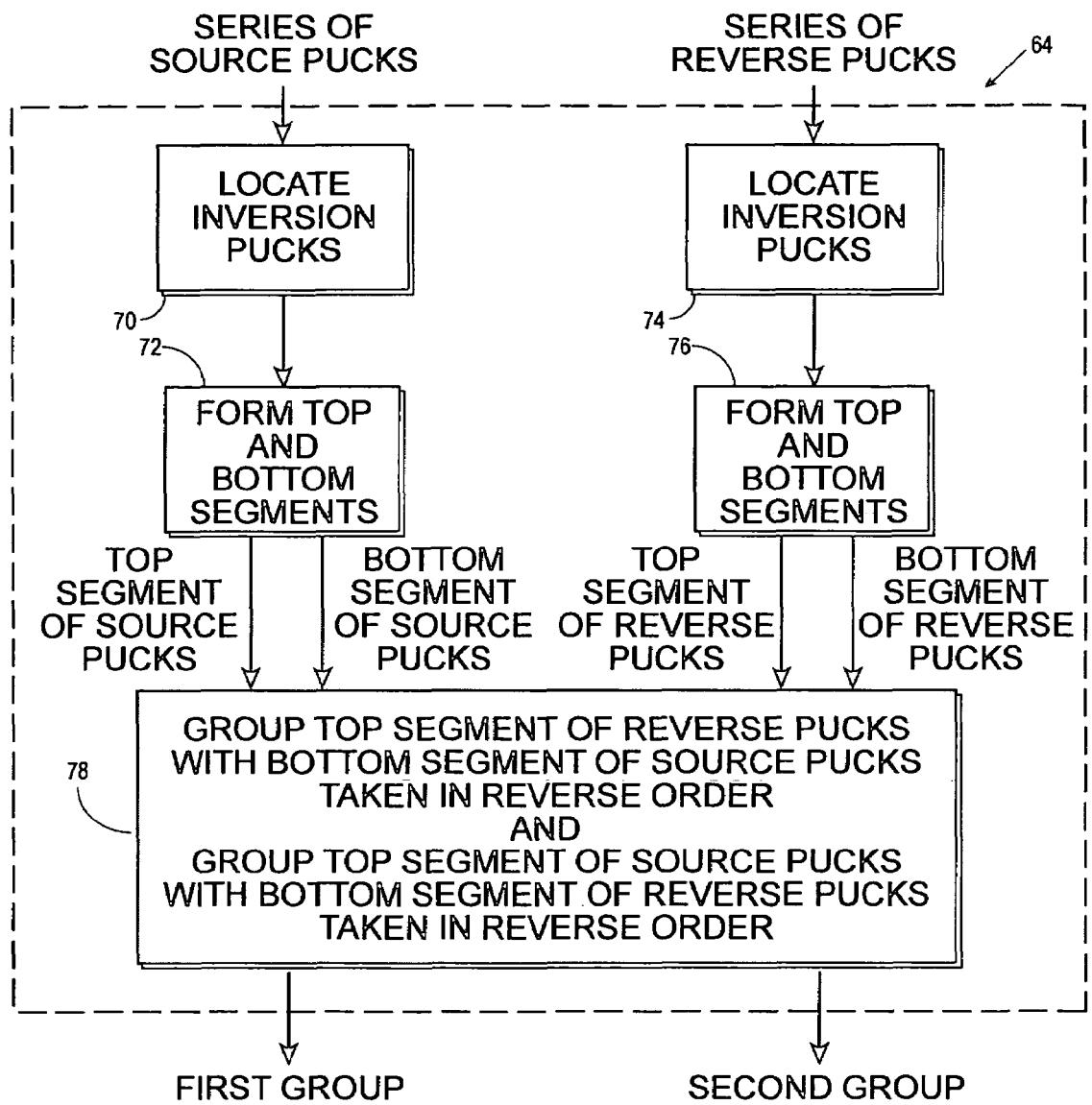
FIG. 9 shows a flow chart illustrating one embodiment of a grouping subroutine for forming the first group and second group in accordance with the present invention.

The grouping subroutine 64 is shown in more detail in FIG. 9. In the grouping subroutine 64, the control unit branches to a step 70, wherein the inversion pucks are located within the series of source pucks by identifying at least one source puck in the series of source pucks having two symbols which are equal or the same, as discussed above. The control unit 18 then branches to a step 72, wherein the series of source pucks are segmented generally about the inversion pucks so as to form a top segment of source pucks (also referred to herein as a "first segment") and a bottom segment of source pucks (also referred to herein as a "second segment"). The top segment of source pucks includes the inversion pucks and all the source pucks that precede the inversion pucks in the series of source pucks. The bottom segment of source pucks includes the inversion pucks and the source pucks that succeed the inversion pucks in the series of source pucks.

Likewise for the series of reverse pucks, the control unit 18 in a step 74 locates the one or more inversion pucks within the series of reverse pucks by identifying at least one reverse puck in the series of reverse pucks having two symbols that are equal or the same, in a manner as discussed above. The control unit 18 then branches to a step 76, wherein the series of reverse pucks are segmented generally about the inversion pucks to form a top segment of reverse pucks (also referred to herein as a "third segment") and a bottom segment of reverse pucks (also referred to herein as a "fourth segment"). The top segment of reverse pucks includes the inversion pucks and the reverse pucks that precede the inversion puck in the series of reverse pucks. The bottom segment of reverse pucks includes the inversion pucks and the reverse pucks that succeed the inversion pucks in the series of reverse pucks.

Although the grouping subroutine 64 is discussed above in terms of the steps 70 and 72 and then the steps 74 and 76, it should be understood that the steps 70 and 72 can be preformed subsequent to or simultaneously with the steps 74 and 76.

Once the source pucks and the reverse pucks have been segmented in the steps 72 and 76, respectively, the control unit branches to a step 78 of the grouping subroutine 64, wherein the top segment of reverse pucks is grouped with the bottom segment of source pucks taken in reverse order to form the first group; and the top segment of source pucks is grouped with the bottom segment of reverse pucks taken in reverse order to form the second group. (See FIGS. 4N and 4O for an exemplary first group and an exemplary second group, respectively, which results from the series of source pucks of FIG. 4G and the series of reverse pucks of FIG. 4M.)

Once the first group and second group are formed in the step 64, the control unit 18 at this point utilizes the first group and the second group as an input to different sets of logic, although the sets of logic are similar. The first group will be discussed first for purposes of clarity of understanding. However, it should be understood that the logic for the first group and the logic for the second group can be performed in any order or simultaneously.

As shown in FIG. 3, after the first group is formed in step 64, the control unit 18 branches to a step 82, wherein the source pucks and the reverse pucks in the first group are reordered to form an ordering referred to herein as a "first group bubble." In general, the process of reordering the source pucks and reverse pucks is referred to herein by the Applicant by the term "bubbling" or derivations thereof. To bubble the first group to form the first group bubble, the first reverse puck in the top segment of reverse pucks is assigned to a first entry of the first group bubble, followed by a plurality of entries comprising pairings of each succeeding reverse puck in the top segment of reverse pucks with its corresponding precedential source puck in the reverse ordered, bottom segment of source pucks. This operation is more specifically referred to as "Right/Left" bubbling.

Figures 4P, 4Q, 4R:
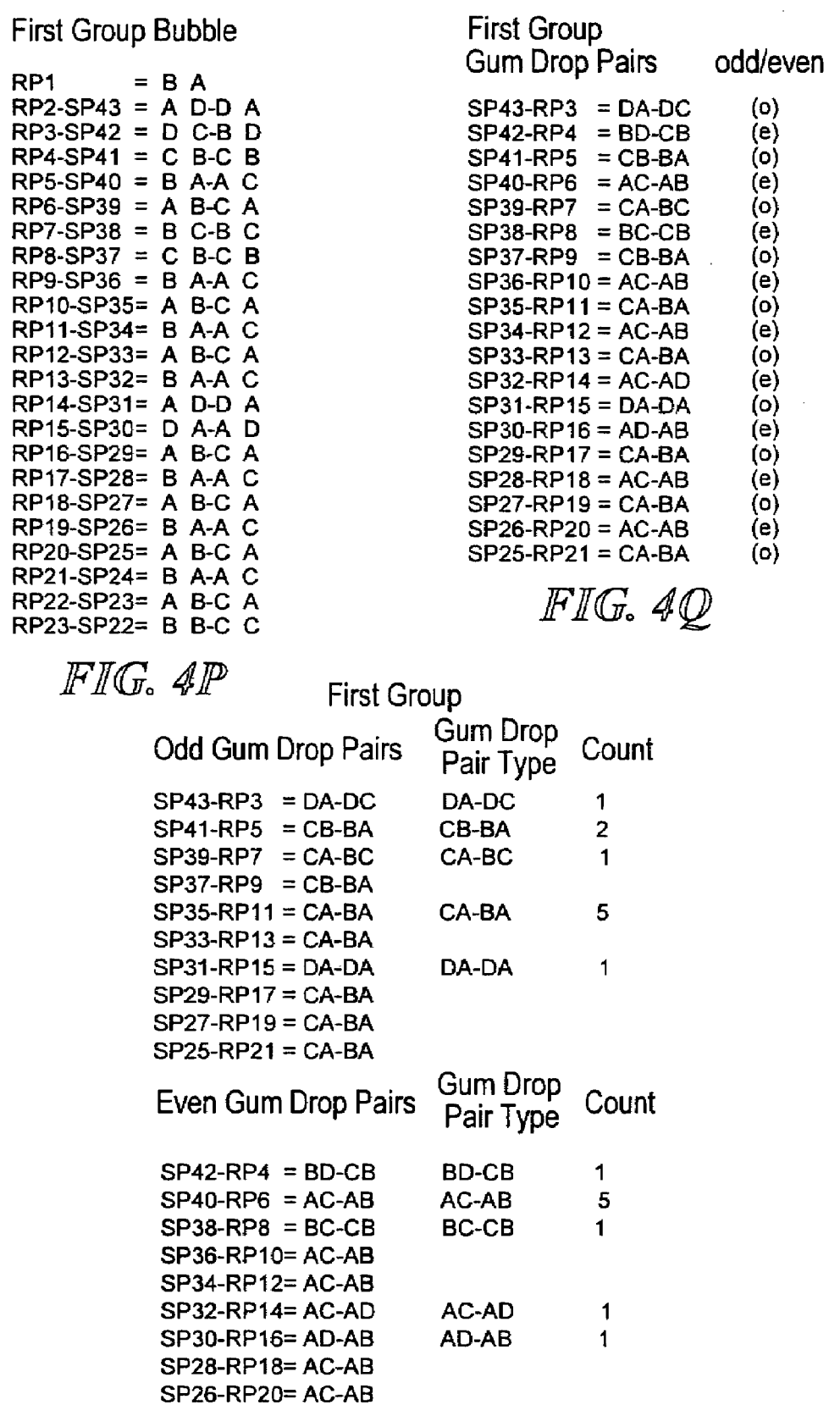

Each of the reverse relationship pairings resulting from the bubbling step 82 is referred to herein by the Applicant by the term "duet." The final duets or last entries of the first group bubble, which includes the pairings of the inversion pucks in the top segment of reverse pucks and the inversion pucks in the reverse ordered bottom segment of source pucks, are referred to herein as "inversion duets." For example, shown in FIG. 4P is an exemplary first group bubble resulting from the bubbling of the first group of FIG. 4N in a manner as discussed above. The first reverse puck (RP1) is given as BA, which is followed by a plurality of duets starting with AD-DA (RP2-SP43), DC-BD (RP3-SP42), CB-CB (RP4-SP41), and so on. The last two entries of the first group bubble are the inversion duets AB-CA (RP22-SP23) and BB-CC (RP23-SP22). (Note that the duets, as well as other combinations of pucks, are shown and discussed herein with a "-" placed therebetween for purposes of visual clarity, and the "-" generally has no other value or significance with regards thereto).

It can be seen that the first reverse puck in the first group bubble is not paired in a duet. This first unpaired puck is referred to herein by the Applicant by the term "bubble scum." The set of duets following the bubble scum, with the exclusion of the inversion duets, is referred to herein by the term "bubble core."

The adjacent pucks in adjacent duets in the bubble core in a sense "glue" the pucks together and when taken in the correct order in the bubble, substantially define the original input stream. Therefore, as part of the super cooling process, they are paired together in step 82 to form a plurality of entities referred to by the Applicant as "gum drop pairs" or "gum pucks". In other words, the gum drop pairs are pairings of adjacent pucks in adjacent duets in the bubble core (one being a source puck from a preceding duet and one being a reverse puck from a succeeding duet). The gum drop pairs are also referred to herein by the Applicant by the terms "inner pairs." The collective gum drop pairs are referred to herein by the Applicant as a "bubble gum set." Because the gum drop pairs are formed only within the bubble core, it can be seen that two pucks, the first and last pucks in the bubble core, will not have an adjacent puck to be paired with to form a gum drop pair, and therefore are not part of the bubble gum set.

For example, shown in FIG. 4Q is the bubble gum set comprising the gum drop pairs for the first group as determined from the first group bubble of FIG. 4P. The first gum drop pair of the bubble gum set shown in FIG. 4Q is the pairing of the adjacent pucks in the first pair of adjacent duets in the bubble core, which is DA-DC (SP43-RP3). The following gum drop pairs are BD-CB (SP42-RP4), CB-BA (SP41-RP5), and so on, and ends with the last gum drop pair of CA-BA (SP25-RP21). It can be seen that the first and last pucks in bubble core shown in FIG. 4P, which are AD (RP2) and AC (SP24) are not part of the bubble gum set.

The next stage of the super cooling process performed by the control unit 18 involves a summarization technique. In the previous steps of the super cooling process discussed above, the relative order of entities has been generally maintained. In the following steps, the entities are summarized. These summation entities result in an unordered representation of at least a portion of the input stream, containing in them positional information.

Once the first group bubble has been formed in the step 82, the control unit 18 branches to a summarization subroutine, which is shown in FIG. 3 as a step 98. In general, in the summarization subroutine 98, the gum drop pairs are summarized so as to represent the information therein in a more concise manner. To summarize the gum drop pairs, the set of gum drop pairs are evaluated to determine how many gum drop pairs contain the same sequence of drops or symbols. For each unique sequence or combination of drops within the set of gum drop pairs, which is also referred to herein as a "gum drop pair type", a count value is assigned representing the number of gum drop pairs which contain that gum drop pair type.

Figure 10:
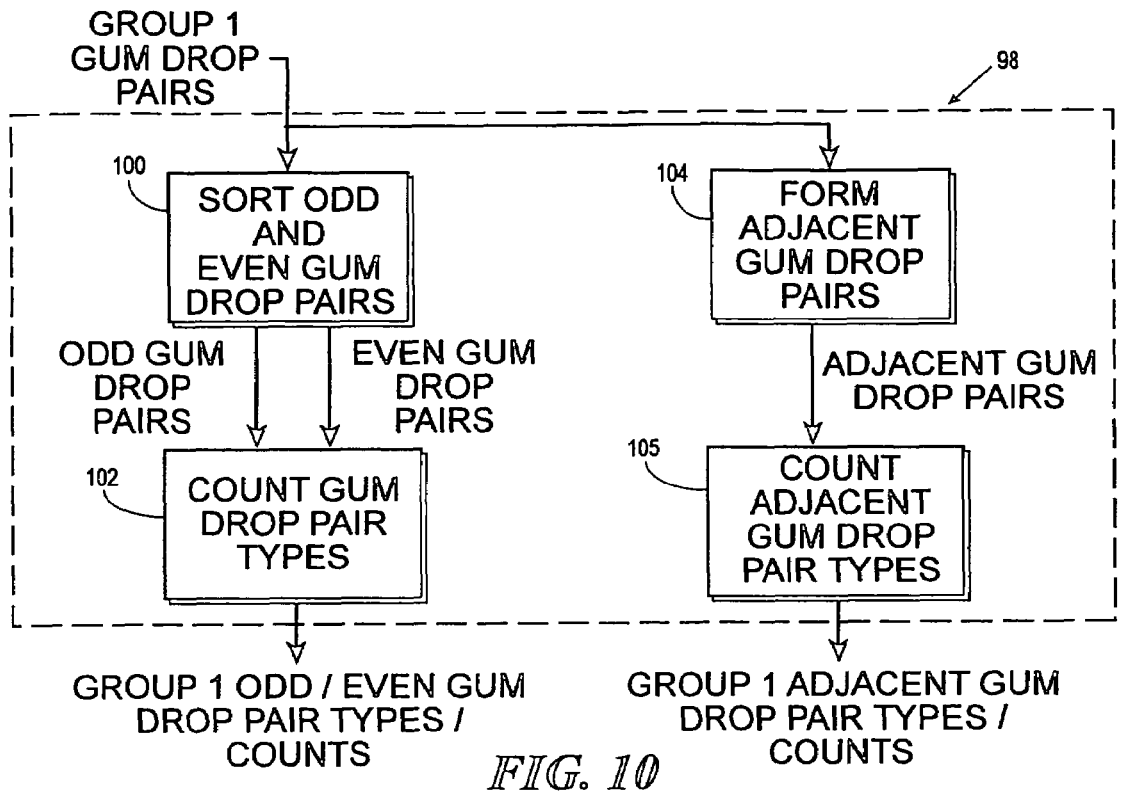
FIG. 10 shows a summarization subroutine for the gum drop pairs of the first group.

One embodiment of the summarization subroutine 98 is shown in more detail in FIG. 10. In a first step 100 of the summarization subroutine 98, the gum drop pairs in the first group bubble are defined as an "odd" or "even" depending on the placement or order of the gum drop pair within the bubble gum set of the first group bubble. For example, also shown in FIG. 4Q next to each gum drop pair is an odd/even assignment for purposes of illustration, wherein each of the odd gum drop pairs are identified by the character "o" next to the gum drop pair, and each of the even gum drop pairs are identified by the character "e" next to the gum drop pair.

In a step 102 of the summarization subroutine 98, the odd set of gum drop pairs are evaluated to determine how many gum drop pairs contain the same sequence of drops or symbols, i.e., have the same gum drop pair type; and similarly the even set of gum drop pairs are evaluated to determine how many gum drop pairs have the same gum drop pair type. For each unique gum drop pair type contained within the sets of odd and even gum drop pairs, a count value is assigned representing the number of gum drop pairs which contain that gum drop pair type in both the odd set of gum drop pairs and the even set of gum drop pairs. For example, shown in FIG. 4R is the odd set of gum drop pairs of FIG. 4Q for the first group, and the unique gum drop pair types from the odd set with the count of gum drop pairs having that unique gum drop pair type. Below the odd set of gum drop pairs in FIG. 4R is the even set of gum drop pairs of FIG. 4Q for the first group, and the unique gum drop pair types from the even set with the count of gum drop pairs having that unique gum drop pair type.

While the summarization subroutine 98 has been described above in one embodiment as defining the gum drop pairs as odd or even in step 100 and then determining gum drop pair types and counts for the odd and even set of gum drop pairs in step 102, it should be understood that the odd/even characterization of step 100 can be dropped and the gum drop pair types and counts be determined for the collective set of gum drop pairs in step 102.

Also, the present invention contemplates that the gum drop pairs can be summarized and represented in a different manner. For example, it can be seen that there is a correspondence between adjacently disposed gum drop pairs in that the second or right puck (i.e., the right pair of two symbols or drops) of a preceding gum drop pair has a reverse relationship with the first or left puck (i.e., the left pair of two symbols or drops) of a succeeding gum drop pair. For example, if the right puck of the preceding gum drop pair includes the symbols DC, which represents the value 1110, the left puck of the succeeding gum drop pair includes symbols which represent the reverse of that value, 0111, which is BD.

To utilize this relationship between adjacently disposed gum drop pairs, the summarization subroutine 98 in one embodiment further includes a step 104 which takes the gum drop pairs resulting from the step 82 for the first group bubble and represents them in a partial form, which is referred to herein by the Applicant by the term "adjacent gum drop pairs". In general, to form each adjacent gum drop pairs in the step 104, two consecutive and adjacently disposed gum drop pairs (one odd and one even) are taken together, which is referred to herein by the Applicant as a "fully qualified" representation of the gum drop pairs. Then, from the adjacent gum drop pairs, the repetitive information in the preceding gum drop pair is omitted. The process of removing the repetitive information in the representation of two adjacently disposed gum drop pairs is referred to herein by the Applicant as a "partially qualified" representation of gum drop pairs.

For example, shown in FIG. 4S are the fully qualified adjacently disposed gum drop pairs for the first group of FIG. 4Q, and the resulting partially qualified adjacent gum drop pairs derived therefrom. The omitted puck in the adjacent gum drop pairs is represented by a ":" in FIG. 4S for purposes of illustration and clarity, however it should be understood that the ":" has no other significance in regards thereto. The three remaining pucks of the adjacent gum drop pairs is referred to herein by the Applicant as a "triplet." However, it should be understood that each of the adjacent gum drop pairs includes information indicative of two gum drop pairs (one even and one odd), and thus is actually indicative of four pucks.

Once the partially qualified adjacent gum drop pairs for the first group are formed in the step 104, the control unit 18 branches to a step 105, wherein the set of adjacent gum drop pairs are evaluated to determine any adjacent gum drop pairs which contain the same sequence of drops or symbols, in a similar manner as discussed above for the gum drop pair counts. For each unique sequence of drops in the adjacent gum drop pairs, which is referred to herein as an "adjacent gum drop pairs type", a count value is assigned representative of the number of the adjacent gum drop pairs which contain that sequence. For example, also shown in FIG. 4S are the corresponding adjacent gum drop pairs types and counts for the first group.

A final step 106 performed by the control unit 18 for the super cooling process for the first group is to derive a super cooled set for the first group, which represents a portion of the information within the original input stream in a different form containing positional information. In one embodiment, the super cooled set includes data indicative of the following elements for the first group: 1) the total number of droplets in the input stream, 2) the number of source pucks in the first group, 3) the number of reverse pucks in the first group, 4) the bubble scum puck for the first group, 5) the starting or first gum drop pair and the starting adjacent gum drop pairs in the bubble gum set for the first group, 6) the ending or last gum drop pair and ending adjacent gum drop pairs in the bubble gum set for the first group, 7) the odd and even gum drop pair types and counts 8) the adjacent gum drop pairs types and counts for the first group, 9) the inversion pucks (or duets) in the first group, and 10) the padding droplets (after spray).

For example, shown in FIG. 4T is an exemplary super cooled set for the first group. (Note that element ten is not applicable in the exemplary super cooled set since the exemplary input stream from which it is derived did not have any padding droplets, and is denoted as such in FIG. 4T by a "N/A" for purposes of illustration. Also, the parenthetical references in FIG. 4T are only included for purposes of illustration and clarity.)

In a similar manner as the first group, once the second group has been formed in the step 64, the control unit branches to a step 110 as shown in FIG. 3, wherein the source pucks and the reverse pucks in the second group are reordered to form an ordering referred to herein as a "second group bubble". Similar to the step 82 discussed above for the first group bubble, to form the second group bubble in the step 110, the first source puck in the top segment of source pucks (or the bubble scum of the second group bubble) is followed by a plurality of pairings of each succeeding source puck in the top segment of source pucks with its corresponding precedential reverse puck in the reverse ordered, bottom segment of reverse pucks. These pairings are likewise referred to as duets, with the final pairings being inversion duets of the second group bubble. The set of duets, excluding the inversion duets, is likewise referred to as the bubble core of the second group bubble. Similarly, a pairing of adjacent pucks in adjacent duets in the bubble core of the second group bubble (one being a reverse puck from a preceding duet and one being a source puck from a succeeding duet) is likewise referred to herein by the term "inner pair," or "gum drop pair" and the collective gum drop pairs of the second bubble group are referred to herein by the term "bubble gum set" for the second group. Again, the first and last puck in the bubble core will be unpaired and are not be used to form a gum drop pair.

For example, shown in FIG. 4U is an exemplary second group bubble resulting from bubbling of the second group of FIG. 4O in a manner as discussed above, and shown in FIG. 4V is the bubble gum set comprising the gum drop pairs for the second group as determined from the second group bubble of FIG. 4U.

Figure 11:
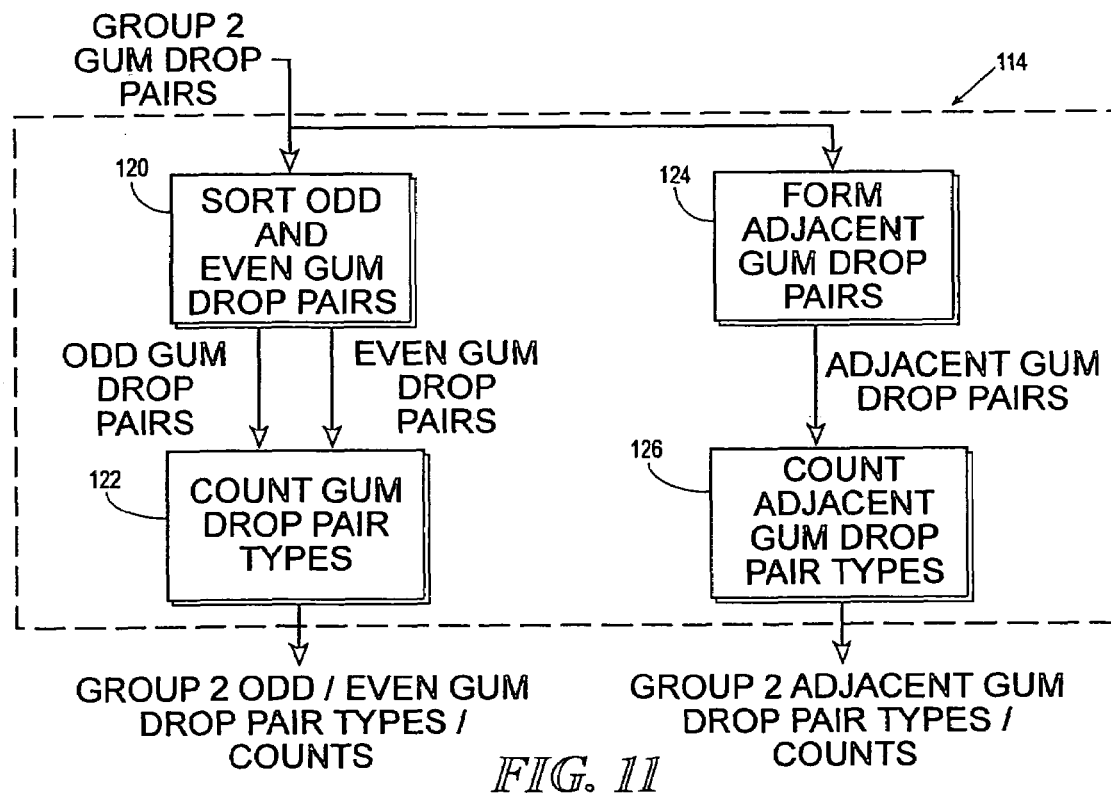
FIG. 11 shows a summarization subroutine for the gum drop pairs of the second group.

Once the second group bubble has been formed in the step 110, the control unit 18 branches to a summarization subroutine which is shown in FIG. 3 as a step 114. Once embodiment of the summarization subroutine 114 for the second group, which is similar to the summarization subroutine 98 discussed above for the first group, is shown in more detail in FIG. 11. In a first step 120 of the summarization subroutine 114, the gum drop pairs in the second group bubble are defined as an "odd" or "even" depending on the placement or order of the gum drop pair within the bubble gum set of the second group bubble. For example, also shown in FIG. 4V next to each gum drop pair is an odd/even assignment for purposes of illustration, wherein each of the odd gum drop pairs are identified by the character "o" next to the gum drop pair, and each of the even gum drop pairs are identified by the character "e" next to the gum drop pair.

In a step 122 of the summarization subroutine 114, the odd set of gum drop pairs are evaluated to determine how many gum drop pairs contain the same sequence of drops or symbols, and similarly, the even set of gum drop pairs are evaluated to determine how many gum drop pairs contain the same sequence of drops or symbols. For each unique sequence of drops contained within the odd and even gum drop pairs, which is also referred to herein as a "gum drop pair type", a count value is assigned representing the number of gum drop pairs which contain that gum drop pair type in both the odd set of gum drop pairs and the even set of gum drop pairs for the second group. For example, shown in FIG. 4W is the odd set of gum drop pairs of FIG. 4V for the second group, and the unique gum drop pair types from the odd set with the count of gum drop pairs having that unique gum drop pair type. Below the odd set of gum drop pairs in FIG. 4W is the even set of gum drop pairs of FIG. 4V for the second group, and the unique gum drop pair types from the even set with the count of gum drop pairs having that unique gum drop pair type.

While the summarization subroutine 114 has been described above in one embodiment as defining the gum drop pairs as odd or even in step 120 and then determining gum drop pair types and counts for the odd and even set of gum drop pairs in step 122, it should be understood that the odd/even characterization of step 120 can be dropped and the gum drop pair types and counts determined for the collective set of gum drop pairs in step 122.

Similar to the summarization subroutine 98 discussed above for the first group, the summarization subroutine 114 for the second group in one embodiment includes a step 124 wherein adjacent gum drop pairs are formed from the gum drop pairs of the second group. Then once the adjacent gum drop pairs for the second group are formed, the control unit 18 branches to a step 126 wherein the set of adjacent gum drop pairs are evaluated to determine the adjacent gum drop pairs types and counts for the second group. For example, shown in FIG. 4X are the resulting fully and partially qualified adjacent gum drop pairs for the second group of FIG. 4V, and the corresponding adjacent gum drop pairs types and counts.

As shown in FIG. 3, a final step 128 performed by the control unit 18 for the super cooling process for the second group is to derive a super cooled set for the second group, which represents a portion of the information within the original input stream in a different form, containing positional information, in a similar manner as discussed above in step 106 for the first group. In one embodiment, the super cooled set includes data indicative of the following elements for the second group: 1) the total number of droplets in the input stream, 2) the number of source pucks in the second group, 3) the number of reverse pucks in the second group, 4) the bubble scum puck for the second group, 5) the starting or first gum drop pair and the starting adjacent gum drop pairs in the bubble gum set for the second group, 6) the ending or last gum drop pair and the ending adjacent gum drop pairs in the bubble gum set for the second group, 7) the odd and even gum drop pair types and counts for the second group, 8) the adjacent gum drop pairs types and counts for the second group, 9) the inversion pucks (or duets) in the second group, and 10) the padding droplets (after spray).

For example, shown in FIG. 4Y is a super cooled set for the second group. (Note that element ten is not applicable in the exemplary super cooled set since the exemplary input stream from which it is derived did not have any padding droplets, and is denoted as such by a "N/A" for purposes of illustration. Also, the parenthetical references in FIG. 4Y are only included for purposes of illustration and clarity.)

It should be understood that while the super cooled sets for the first and second groups have been described herein in one embodiment as including ten elements each, elements within the super cooled set for the first group and for the second group (taken individually or in combination) which lend themselves to being repetitive, redundant, or otherwise unnecessary can be omitted accordingly (however redundancy can be beneficial, such as for example for checking validity or to ensure structural consistency between super cooled sets). For example, since the number of droplets in the input stream is already provided in the super cooled set for the first group, it may be omitted from the second group. Further, elements that lend themselves to being derived from one or more other elements can likewise be omitted accordingly since such information can be obtained indirectly form the other elements. Further, while the super cooling process has been discussed in terms of generating a super cooled set for the first group and a super cooled set for the second group, it should be understood that the elements thereof may be combined together and provided in a common super cooled set in accordance with the present invention.

Once the super cooled sets are determined for the first group and second group in the steps 106 and 128, respectively, the control unit 18 outputs the super cooled sets so that the super cooled sets can be utilized (e.g., transmitted and/or stored).

The super cooled sets of the present invention can be outputted in its whole form, which the Applicant refers to herein as being in an "open box mode" representation of the input stream. This is the preferred mode of representing the input stream when the information within the input stream is not sensitive to confidentiality or in the public domain. However, in instances where information is of a confidential or sensitive nature, each of the super cooled sets is "encrypted" by a method referred to herein by the Applicant by the term "lock box mode." Because the lock box mode can be applied similarly to any super cooled set, only the super cooled set for the first group is discussed in further detail with reference to FIGS. 12A-12B for purposes of brevity and clarity.

The lock box mode consists of a "lock" component 170, a "key" component 172 and a "combination" component 174, that when combined, provides the super cooled set in the open box mode. To "lock" the super cooled set so as put the super cooled set in the lock box mode, at least a portion of the super cooled set for the first group is divided into two parts, one of which is used for forming the lock component 170 and one of which is used for forming the key component 172. In one embodiment, the adjacent gum drop pair types and counts of the super cooled set is the portion of the super cooled set which is divided into the two parts, as shown for example in FIG. 12A. The division of the adjacent gum drop pairs types and counts can be done in any manner, but are preferably divided so as to maximize bandwidth efficiency. A predetermined mathematical operation is then applied to the counts in each part, which results in the lock component 170 and the key component 172. In one embodiment, as shown for example in FIG. 12A, the mathematical operations are predetermined numbers which are added to or subtracted from the adjacent gum drop pair counts.

The combination component 174 of the lock box mode is the reverse of the mathematical operations applied to form the lock component 170 and key component 172. Therefore it can be seen that to transform the super cooled set from the lock box mode to the open box mode, the combination component 174 (which reverses the mathematical operation for each adjacent gum drop pair count) is applied to the lock component 170 and to the key component 172. The resulting adjacent gum drop pair counts in the lock component 170 are then combined to the resulting adjacent gum drop pairs counts in the key component 172 to obtain the full counts for the adjacent gum drop pairs of the super cooled set for the first group. For example, shown in FIG. 12B is the combination component 174 being applied to the lock component 170 and key component 172 of FIG. 12A, and the resulting super cooled set in the open box mode after the resulting adjacent gum drop pairs of the lock component 170 and the key component 172 have been combined.

In the lock box mode, the lock component 170, the key component 172, and the combination component 174 are preferably transmitted and/or stored apart so that there is no indication of the input stream being represented by the super cooled set until the lock, key and combination components 170, 172 and 174 are combined to derive the super cooled set in the open box mode. Further encryption can result from the use of multiple lock components 170, key components 172, and/or combination components 174.

While the present invention is described in one embodiment as encrypting the super cooled input stream set using the lock box mode for transmission and storage, it should be understood that the present invention contemplates that any encryption technique known in the art or later developed can be utilized during the transmission and/or storage of the super cooled input stream set in accordance with the present invention. Further, while only the adjacent gum drop pair counts have been discussed and shown by way of illustration as being modified in the lock box mode, it should be understood that the present invention contemplates that other information contained within the super cooled set can also be modified in the lock box mode.

It should be pointed out that the encoding technique containing positional information of the present invention discussed herein is really a summation process. Counts for each entity defined is in the form similar to the number system used in every day life where counts are expressed in the units ones, tens, hundreds, thousands, etc., to represent the number of objects. This is normally recognized to be a "geometric" representation of the object counts. Therefore by inference, it should be pointed out that this method of summation leads to a "geometric" encoding of information with positional information implicit in it.

Due to the summarization technique of the super cooling process, the present invention allows for information to be present in the encoded and un-coded formats within a frame or fixed memory space (e.g., one megabyte of storage). Along with the un-coded data in this frame, the super cooled sets may represent the en-coded data in some other frame, as shown for example in FIG. 13. Generally, the super cooled sets will represent the en-coded and summarized data in some other frame. Repeated super cooling of data in a frame comprising the super cooled set from the previous or last cycle performed and the non-super cooled data in the current frame (which is new data) is referred to herein by the Applicant by the term "super freezing". This process can be repeated ad-infinitLlm to obtain a final super frozen set consisting of the first group and second group super frozen sets (which is the same as a super cooled set for the final frame) from which all the frames can be derived. In essence what is accomplished is geometric encoding of geometrically compressed information leading to infinite compression.

In addition to the various processes described above, Applicant further presents two other phenomena observed in relation to the super cooling process of the present invention. First, it should be noted that a special case arises in step 32 of the super cooling process if the rippled input stream is rotated to the right in the formation of the source stream, and the duplicate rippled stream is rotated to the left in the formation of the reverse stream, by N positions (rather than N+1 positions). In this case, the source and reverse pucks lose their precedence relationship and exhibit a "mirrored" relationship when they are divided into the first group and second group in step 64, wherein the source pucks and reverse pucks in the same position in the side-by-side comparison are evenly matched (with one exception in the second group: RP 43=AA-SP1=CA). Pucks that are in the same position and exhibiting the mirrored relationship are referred to herein by the Applicant as "twins".

For example, shown in FIG. 14 is the resulting first group and the second group when the exemplary rippled input stream of FIG. 4C is rotated to the right by N droplet positions and the exemplary duplicate rippled stream (which is a duplicate of the rippled input stream of FIG. 4B) is rotated to the left N droplet positions. The mirrored relationships are indicated by a horizontal line drawn between the reverse pucks and source pucks in FIG. 14 for purposes of illustration.

With regard to the second observation, it was discussed above in reference to the super cooling process that the source pucks and the reverse pucks have a precedential reverse relationship when the top half of the source pucks is compared side-by-side to the bottom half of the reverse pucks taken in reverse order, and the top half of the series of reverse pucks is compared side-by-side to the bottom half of the source pucks taken in reverse order. The precedential reverse relationship arises in that substantially each reverse puck in the top half of reverse pucks has a value which is the reverse of the value of a source puck located in a preceding position in the reverse ordered, bottom half of source pucks; and substantially each source puck in the top half of source pucks has a value which is the reverse of the value of a reverse puck in the top half of reverse pucks. By taking the duets, which are the pairs of reverse pucks and source pucks having the precedential reverse relationship, it can be seen that the duets have a double helix arrangement, similar to that seen in DNA.

Figures 15, 16A:
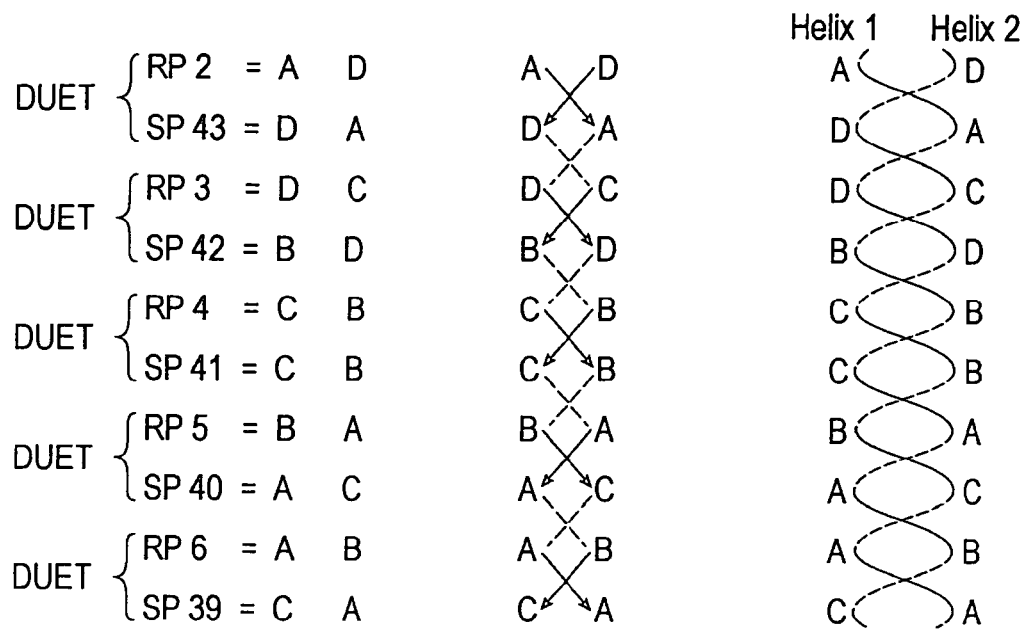
FIG. 15 shows a double helix structure associated with an exemplary subset of duets of the present invention.
FIG. 16A-16B cooperate to show application of one embodiment of a transformation process to the subset of duets of FIG. 20, more particularly.

For example, shown in FIG. 15 is a subset of duets taken from the exemplary bubble core of duets of FIG. 4P for the first group. Next to the subset of duets are two representations of the subset. In the leftmost representation of the subset, the reverse relationship between drops of the duets are shown by arrows drawn therebetween. The non-relationships (as between adjacent duets) are shown by the dotted lines drawn therebetween. If the arrows and the dotted lines are taken to be part of the same line, they result in a double helix, as shown in the rightmost representation of the subset. Applicant believes this phenomenon explains how the double helix nature of the DNA structure comes about.

Figure 16B:
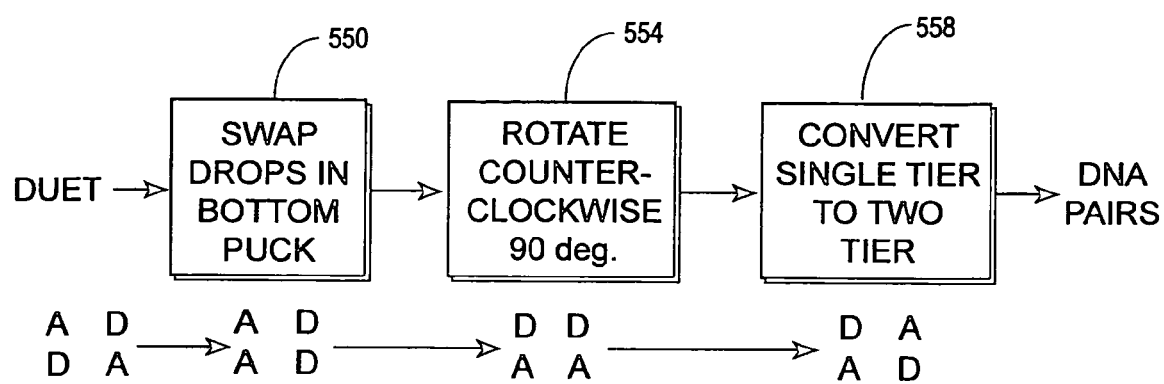

It is Applicant's belief that the bubble groups of the super cooling process of the present invention is the same as DNA, but in a slightly different mold. To see how the arrangement of drops from the exemplary subset of duets of FIG. 15 relates to the double helix arrangement of DNA, a transformation process is applied to the subset of duets, as shown in FIGS. 16A-16B and as discussed further below. The Applicant believes that the reason for this modification is the nature of replication associated with DNA. The rightmost structure of FIG. 15 does not lend itself to easy replication.

Shown in FIG. 16A is the subset of duets in the different stages of the transformation process, as will be discussed further below with reference to FIG. 16B. In FIG. 16A, the subset of duets is shown first. Shown next thereto is a representation of a first double helix structure (as indicated by the vertical and horizontal lines) for the subset of duets after the first step of the transformation (labeled as process 550) is applied. Then shown is a second double helix structure using a single tier encoded representation of the subset of duets using the first helix and resulting in the second helix structure from the next step of the transformation process (labeled as process 554), followed by a two tier encoded DNA representation with the first helix and the second helix resulting from the last step of the transformation process (labeled as process 558).

Note that the letters "A", "B", "C", and "D" are used in the DNA representation here. They map to the common DNA sequence letters "A", "C", "G", and "T" although not necessarily on a one-to-one basis.

The transformation process applied to the subset of duets is shown in a general flow diagram in FIG. 16B, with an example shown below wherein the first duet of the subset of duets is shown during each step of the transformation process for purposes of illustration. From the illustration of the transformation process for the first duet, one skilled in the art will understand how to apply the transformation process to the other duets.

As shown in FIG. 16B, in a step 550 of the transformation process, the drops in the bottom or second puck in the duet are swapped or reversed in order. For example, as shown in FIG. 16B for the first duet, the bottom puck is the source puck DA. After swapping the drops in the bottom puck, the bottom puck of the duet now has a value of AD (as also shown in FIG. 16A). In a step 554, the set of four drops in the duet at this point are then rotated counter-clockwise by one position or ninety degrees. For example, as shown in FIG. 16B, the result of rotating the set of four drops in the duet is a top "puck" with a value DD and a bottom "puck" with a value AA (as also shown in FIG. 16A). In a step 558, the drops at this point are then converted from single tier encoding to two-tier encoding. For example, as shown in FIG. 16B, the result of converting the drops from single tier encoding to two-tier encoding is a top "puck" with a value DA and a bottom "puck" with a value AD (as also shown in FIG. 16A). Each of the resulting "pucks" of the transformation process is referred to herein by the Applicant as a "DNA pair".

Thus it can be seen that the reverse of the transformation process applied to two adjacent DNA pairs yields the duets of the bubble core. In other words, by taking two adjacent DNA pairs, converting the DNA pairs to single tier encoding, rotating the DNA pair values clockwise by ninety degrees, and reversing the order of the bottom pair, the duet values result and can be subsequently decoded into an ordered binary stream by reversing the steps recited above for encoding the ordered binary stream into the DNA pair values. Therefore, Applicant believes that one application of the present invention is its use in converting the helix structure of DNA into a binary sequence so as to retrieve a data stream in the form of 0's and 1's which represents the information contained in the DNA structure.

Further, the Applicant believes that if the DNA sequence has strictly sequenced information and their summarized values are to be found in the stem cell set, then transforming the DNA to a binary sequence of values and super cooling it would yield information that closely corresponds to those facets of the stem cell set which are represented in the DNA. From this established correspondence, it should be possible to derive the binary sequence of those features of the stem cell set which are not represented in the DNA, such as the regeneration of most organs.

From the above description, it is clear that the present invention is well adapted to carry out the objects and to attain the advantages mentioned herein, as well as those inherent in the invention. Although the foregoing invention has been described in some detail by way of illustration and example for purposes of clarity of understanding, it will be apparent to those skilled in the art that certain changes and modifications may be practiced without departing from the spirit and scope of the present invention, as described herein. Thus, the present invention is not intended to be limited to the embodiment shown but is to be accorded the widest scope consistent with the principles and features described herein.

What is claimed is:

1. A method for encoding an ordered binary stream, the method comprising the steps of:
converting the ordered input binary into an ordered input quad stream by taking two adjacent binary values to form drops; and using encoding on drops to form the ordered input quad stream.

2. The method of claim 1, wherein the step of encoding is defined further as encoding the drops into a single tier format.

3. The method of claim 2, wherein the binary stream in the single tier format is taken as a whole.

4. The method of claim 1, wherein the step of encoding is defined further as encoding the drops into a two-tier format.

5. The method of claim 4, wherein the two-tier format includes an odd component and an even component.

6. A method for encoding an ordered binary input stream, comprising the steps of:
analyzing the length of the ordered binary input stream to determine whether the number of digits in the ordered binary input stream is an odd multiple of four; and
appending the ordered binary input string with a number of digits sufficient to increase the length of the ordered binary input stream to a number of digits that is an odd multiple of four.

7. The method of claim 6, further comprising the step of inserting alternately 0's and 1's starting with either a "0" or a "1" into the ordered binary input stream, after the binary strings have been appended thereto, after each binary value of the ordered input stream to obtain a rippled binary stream retaining the original order of the ordered binary input stream.

8. The method of claim 7, further comprising the steps of:
copying the rippled binary stream to form two identical rippled binary streams;
rotating one of the rippled binary streams to the right a number of positions to produce a source stream; and
rotating the other one of the rippled binary streams to the left the same number of positions and reversing the rippled binary stream that has been previously rotated to the left to form a reverse stream.

9. The method of claim 8, further comprising the step of converting the source and reverse binary streams into quad streams by representing each adjacent pair of bits by a letter indicative of the value of the adjacent pair.

10. The method of claim 9, wherein adjacent letters in the quad streams are characterized as drops and wherein adjacent drops form drop pairs representative of the source stream and reverse stream with the ordering of the drop pairs in the source stream and reverse stream representing positional information with respect to the original binary input stream.

11. The method of claim 10, further comprising the step of dividing each of the source and reverse streams into substantial halves to form a top half and a bottom half of the source stream, and a top half and a bottom half of the reverse stream; such that the top half and the bottom half of each of the source and reverse streams includes at least one drop pair having same drop values.

12. The method of claim 11, further comprising the step of forming two segments, one of the segments comprising the top half of the source stream and the bottom half of the reverse stream, and the other one of the segments comprising the top half of the source stream and bottom half of the reverse stream.

13. The method of claim 12, further comprising the step of indexing, in one of the segments, the top half of the source stream and the bottom half of the reverse stream in a side-by-side relationship such that the drop pairs in the top half of the source stream have a same but reverse relationship to the drop pairs in the bottom half of the reverse stream.

14. The method of claim 13, further comprising the step of indexing, in the other one of the segments, the bottom half of the source stream and the top half of the reverse stream in a side-by-side relationship such that the drop pairs in the bottom half of the source stream have a same but reverse relationship to the drop pairs in the top half of the reverse stream.

15. The method of claim 14, further comprising the step of merging the drop pairs in the segments such that the drop pairs having a side-by-side relationship form duets having the same binary values but reversed in order.

16. The method of claim 15, wherein the resultant merged drop pairs form a "bubble", and wherein the bubble includes a first drop pair which is unpaired, followed by a series of duets to form a "bubble core".

17. The method of claim 16, wherein a second drop pair of a top most duet and a first drop pair of a second duet form an adjacency relationship to form adjacent gum drop pairs; the set of all adjacent gum drop pairs together with the top most drop pair and the bottom most drop pair of the bubble core, and the unpaired first drop pair represent the binary input stream.

18. The method of claim 15, wherein the duets of the bubble core exhibit a property commonly understood as a double helix DNA sequence.

* * * * *

UNITED STATES PATENT AND TRADEMARK OFFICE
CERTIFICATE OF CORRECTION

PATENT NO. : 7,298,293 B2  Page 1 of 1
APPLICATION NO. : 11/436259
DATED : November 20, 2007
INVENTOR(S) : Sarukkai R. Narayanan It is certified that error appears in the above-identified patent and that said Letters Patent is hereby corrected as shown below:

In the Specification:

Column 5, line 66:   After "each" delete "fo" and replace with -- of --.

Column 8, line 32:   Delete "auad" and replace with -- quad --.

Column 18, line 44:  Delete "ad-infinitL1m" and replace with -- ad-infinitum --.

Signed and Sealed this

Sixth Day of May, 2008

JON W. DUDAS
*Director of the United States Patent and Trademark Office*